US011525922B2

(12) United States Patent
Jin et al.

(10) Patent No.: US 11,525,922 B2
(45) Date of Patent: Dec. 13, 2022

(54) IMAGE SENSORS AND DISTANCE MEASURING DEVICES USING THE SAME

(71) Applicant: Samsung Electronics Co., Ltd., Suwon-si (KR)

(72) Inventors: Young Gu Jin, Suwon-si (KR); Young Chan Kim, Seongnam-si (KR); Tae Sub Jung, Hwaseong-si (KR); Yong Hun Kwon, Hwaseong-si (KR); Sung Young Seo, Bucheon-si (KR); Moo Sup Lim, Yongin-si (KR); Sung Ho Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 781 days.

(21) Appl. No.: 16/427,576

(22) Filed: May 31, 2019

(65) Prior Publication Data
US 2020/0174133 A1    Jun. 4, 2020

(30) Foreign Application Priority Data

Dec. 4, 2018  (KR) .................. 10-2018-0154287

(51) Int. Cl.
  *H01L 27/146*  (2006.01)
  *G01S 17/89*   (2020.01)
  *G01S 17/08*   (2006.01)

(52) U.S. Cl.
  CPC ............ *G01S 17/89* (2013.01); *G01S 17/08* (2013.01); *H01L 27/1461* (2013.01); *H01L 27/14614* (2013.01); *H01L 27/14643* (2013.01); *H01L 27/14627* (2013.01)

(58) Field of Classification Search
  CPC ..... G01S 17/89; G01S 17/08; H01L 27/14614
  See application file for complete search history.

(56) References Cited

U.S. PATENT DOCUMENTS

| 7,897,928 | B2 | 3/2011 | Kaufmann et al. |
| 8,513,709 | B2 | 8/2013 | Jin et al. |
| 9,225,922 | B2 | 12/2015 | Lee et al. |
| 9,621,868 | B2 | 4/2017 | Kim et al. |
| 2009/0096901 | A1 | 4/2009 | Bae et al. |

(Continued)

FOREIGN PATENT DOCUMENTS

KR    20070064857 A    6/2007

*Primary Examiner* — Thanh Luu
(74) *Attorney, Agent, or Firm* — Harness, Dickey & Pierce, P.L.C.

(57) ABSTRACT

An image sensor may include a first photo gate and a second photo gate each extending substantially in parallel in a first direction, the first photo gate and the second photo gate isolated from direct contact with each other in a second direction, the second direction substantially orthogonal to the first direction, a first overflow gate between the first photo gate and the second photo gate, the first overflow gate extending in the first direction, a first charge collection region on the first photo gate, a second charge collection region on the second photo gate and isolated from direct contact with the first charge collection region in the second direction, a first floating diffusion region that may receive first charge from the first charge collection region and output the first charge, and a second floating diffusion region that may receive second charge from the second charge collection region and output the second charge.

11 Claims, 33 Drawing Sheets

(56) References Cited

U.S. PATENT DOCUMENTS

| | | | |
|---|---|---|---|
| 2014/0225173 A1* | 8/2014 | Kim | H01L 27/14612 257/292 |
| 2014/0375979 A1* | 12/2014 | Oh | H04N 5/3745 356/5.01 |
| 2016/0005785 A1* | 1/2016 | Barbier | H04N 5/3594 250/208.1 |
| 2016/0049429 A1* | 2/2016 | Lee | H04N 5/37452 257/231 |

* cited by examiner

IMAGE SENSORS AND DISTANCE MEASURING DEVICES USING THE SAME

CROSS-REFERENCE TO RELATED APPLICATION

This application claims priority to Korean Patent Application No. 10-2018-0154287, filed on Dec. 4, 2018, in the Korean Intellectual Property Office, the disclosure of which is hereby incorporated by reference in its entirety.

BACKGROUND

1. Field of the Invention

The present inventive concepts relate to image sensors and distance measuring sensors using the same.

2. Description of the Related Art

As digital cameras, digital video cameras, mobile phones including these functions and the like come into wide use, image sensors are being rapidly developed. Image sensors include semiconductor devices that may convert an optical image, including incident light, into an electrical signal. Research on three-dimensional image sensors, that is, distance sensors capable of simultaneously photographing ("capturing") a two-dimensional (2D) image and a depth image has also being actively conducted in response to a request for images of stereoscopic images.

Distance sensors may include a plurality of charge collection regions in a single pixel.

SUMMARY

Aspects of the present inventive concepts provide an image sensor and a distance measuring sensor using the same. Some example embodiments of the present inventive concepts provide a distance measuring sensor that includes a plurality of charge collection regions in a single pixel, where the distance measuring sensor is configured to restrict the movement between the charges stored in the plurality of charge collection regions, in a section in which the charges are generated in the charge collection region, in order to improve accuracy and reliability of the distance measuring sensor.

According to some example embodiments of the present inventive concepts, an image sensor may include a first photo gate and a second photo gate each extending substantially in parallel in a first direction, the first photo gate and the second photo gate isolated from direct contact with each other in a second direction, the second direction substantially orthogonal to the first direction, a first overflow gate between the first photo gate and the second photo gate, the first overflow gate extending in the first direction, a first charge collection region on the first photo gate, a second charge collection region on the second photo gate and isolated from direct contact with the first charge collection region in the second direction, a first floating diffusion region that may receive first charge from the first charge collection region and output the first charge, and a second floating diffusion region that may receive second charge from the second charge collection region and output the second charge.

According to some example embodiments of the present inventive concepts, a distance measuring sensor may include a light emitter configured to generate a first optical signal, a pixel array configured to receive a second optical signal, the second optical signal generated based on reflection of the first optical signal from an object, the pixel array further configured to generate an electrical output signal based on receiving the second optical signal, and a readout circuit configured to calculate a distance between the light emitter and the object based on the electrical output signal generated by the pixel array. The pixel array may include a first photo gate and a second photo gate. Each photo gate of the first photo gate and the second photo gate may extend substantially in parallel in a first direction. The pixel array may include a first overflow gate between the first photo gate and the second photo gate, the first overflow gate extending in the first direction. A total length of the first overflow gate in the first direction may be greater than a total length of the first photo gate in the first direction.

According to some example embodiments of the present inventive concepts, an image sensor may include a first photoelectric device that extends in a first direction, the first photoelectric device configured to receive an optical signal and convert the optical signal into an electric signal. The image sensor may include a first floating diffusion region configured to receive the electric signal and output the electric signal. The image sensor may include a first transmission gate configured to provide the electric signal stored in the first photoelectric device to the first floating diffusion region. The image sensor may include a first overflow gate on a first surface of the first photoelectric device and extending along the first surface of the first photoelectric device. A total length of the first surface in the first direction may be smaller than a total length of the first overflow gate in the first direction.

However, aspects of the present inventive concepts are not restricted to the one set forth herein. The above and other aspects of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION OF THE EMBODIMENTS

Figure 1:
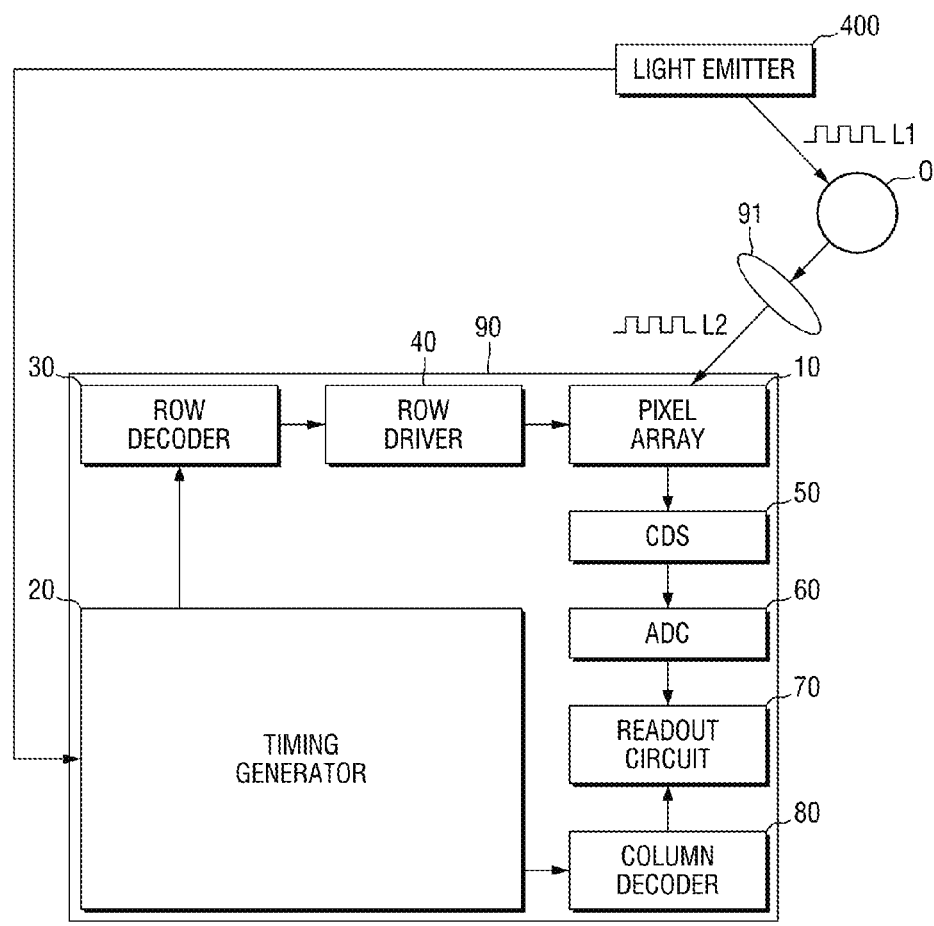
FIG. 1 is an example block diagram illustrating a distance measuring sensor according to some example embodiments.

FIG. 1 is an example block diagram illustrating a distance measuring sensor according to some example embodiments.

Referring to FIG. 1, a distance measuring sensor 1 according to some example embodiments of the present inventive concepts may include a light emitter 400 and an image sensor 90. The light emitter 400 may generate a first optical signal L1. The light emitter 400 may irradiate an object O with the first optical signal L. Restated, the light emitter 400 may direct the first optical signal L to irradiate the object O. The first optical signal L1 may be, for example, infrared rays (e.g., an infrared wavelength spectrum of light), such that the light emitter 400 may be an infrared light emitter, visible rays, such that the light emitter 400 may be a visible light emitter, ultraviolet rays, such that the light emitter 400 may be an ultraviolet light emitter, a sub-combination thereof, or a combination thereof. The first optical signal L1 may be reflected by the object O and provided to the image sensor 90 via a lens 91 as a second optical signal L2. Restated, the light emitter 400 may direct the first optical signal L1 to irradiate the object O such that the first optical signal L is reflected by the object O, where the reflected first optical signal L1, which is generated based on reflection of the first optical signal from the object O, is a second optical signal L2. As described herein, an optical signal may be a beam of light, a pulse of light, a pattern and/or sequence of light emitted over a period of time, a sub-combination thereof, or a combination thereof. The light emitter 400 may transfer information associated with the first optical signal L1 to the image sensor 90.

The image sensor 90 may analyze distance information between the light emitter 400 and the object O, using the second optical signal L2. Specifically, the image sensor 90 may include a pixel array 10, a timing generator 20, a row decoder 30, a row driver 40, a correlated double sampler 50, an analog-digital converter 60, a readout circuit 70, a column decoder 80, and the like. It will be understood that some or all of the timing generator 20, row decoder 30, row driver 40, correlated double sampler 50, analog-digital converter 60, readout circuit 70, column decoder 80, a sub-combination thereof, or a combination thereof may be implemented by an instance of processing circuitry (e.g., a central processing unit (CPU)) executing a program of instructions stored on a memory (e.g., a Solid State Drive (SSD) storage device), where the image sensor 90 includes the instance of processing circuitry and the memory.

The pixel array 10 includes a plurality of pixels arranged two-dimensionally. The pixel array 10 may be configured to receive the second optical signal L2, based on the second optical signal L2 being incident on the pixel array 10. The plurality of pixels are configured to convert a received optical image, which may be an optical signal that is incident upon the pixel array 10, into an electrical output signal. Restated, the pixel array 10 may receive the second optical signal L2 and may generate the electrical output signal based on receiving the second optical signal L2 and converting the received second optical signal into the electrical output signal. The pixel array 10 may receive the second optical signal L2 via the lens 91. The pixel array 10 may be driven based on receiving a plurality of driving signals, including a row selection signal, a reset signal, a transmission signal, a photo gate driving signal, an overflow gate driving signal, a sub-combination thereof, or a combination thereof from the row driver 40. In some example embodiments, the converted electrical output signal is provided to the correlated dual sampler 50 via the vertical signal line.

The timing generator 20 may provide a timing signal and a control signal to the row decoder 30 and the column decoder 80. The timing generator 20 according to some example embodiments may receive information associated with the first optical signal L1 from the light emitter 400. The timing generator 20 may generate a photo gate driving signal, for example, on the basis of the information associated with the first optical signal L1. For example, the timing generator 20 may generate a first signal PG1_S having a same phase as the first optical signal L, and a second signal PG2_S having a phase opposite to the phase of the first optical signal L1, and may provide the first and second signals PG1_S and PG2_S to the decoder 30. It will be understood that the timing generator 20 may generate both the first signal PG1_S and the second signal PG2_S based on the information associated with the first optical signal L1, for example such that the first signal PG1_S has the same phase as the first optical signal L1 and the second signal PG2_S has the phase opposite to the phase of the first optical signal L1. A specific explanation thereof will be given below.

The row decoder 30 may receive the timing signal and the control signal from the timing generator 20, and may control addressing and scanning timing of each row of the pixel array 10.

The row driver 40 may provide a plurality of driving signals to drive the plurality of unit pixels to the pixel array 10, in accordance with the results decoded in the row decoder 30. In general, when the unit pixels are arranged in the form of a matrix, driving signals are provided for each row.

The correlated double sampler 50 may receive, hold and sample the electrical output signals formed at the pixel array 10 via the vertical signal lines. That is, a specific noise level and a signal level due to the electrical output signal are doubly sampled, and an analog signal corresponding to a difference level corresponding to the difference between the noise level and the signal level is generated.

The analog-digital converter 60 may convert the analog signal corresponding to the difference level into a digital signal to generate the digital signal.

The readout circuit 70 may perform image processing on the digital signal depending on the decoding results in the column decoder 80. The readout circuit 70 may process the digital signal to derive distance information or the like associated with the image. Restated, the readout circuit 70 may be configured to calculate a distance between the light emitter 400 and the object O based on the electrical output signal that is generated by the pixel array 10 in response to the pixel array 10 receiving the second optical signal L2.

Figure 2:
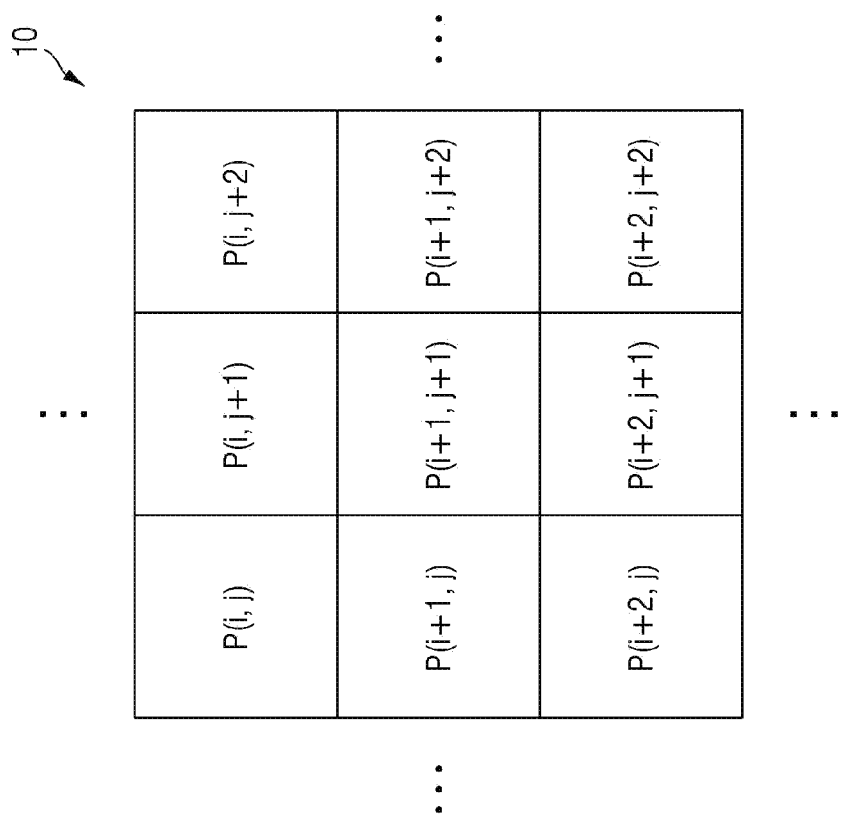
FIG. 2 is an example diagram for illustrating the arrangement of pixel arrays according to some example embodiments in detail.

FIG. 2 is an example diagram for illustrating the arrangement of pixel arrays according to some example embodiments in detail.

Referring to FIG. 2, the pixel array 10 may include a plurality of pixels arranged in rows and columns. In FIG. 2, the pixels positioned at a i-th row and a j-th column are expressed by P (i, j), where i and j are each a positive integer and may be a same integer or different integers. In FIG. 2, for convenience, only three rows and three rows are illustrated, but the present inventive concepts are not limited thereto. That is, the number of rows and the number of columns may variously change.

A horizontal shape of the first pixel region P (i, j) may be a square, but the embodiments are not limited thereto. The first pixel region P (i, j), which may also be described as pixel P (i, j) of the pixel array 10, may be arranged to adjoin an adjacent second pixel region P (i, j+1), which may also be described as pixel P (i, j+1) of the pixel array 10 on the square surface.

Figure 3:
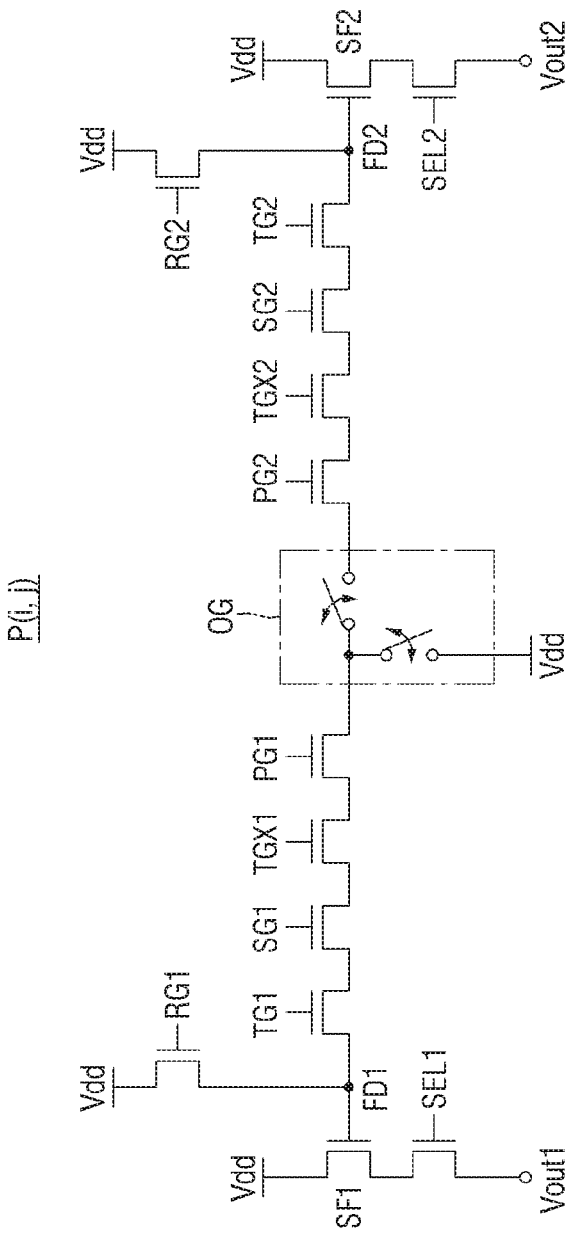
FIG. 3 is an example equivalent circuit diagram of the first pixel region according to some example embodiments.
Figure 4:
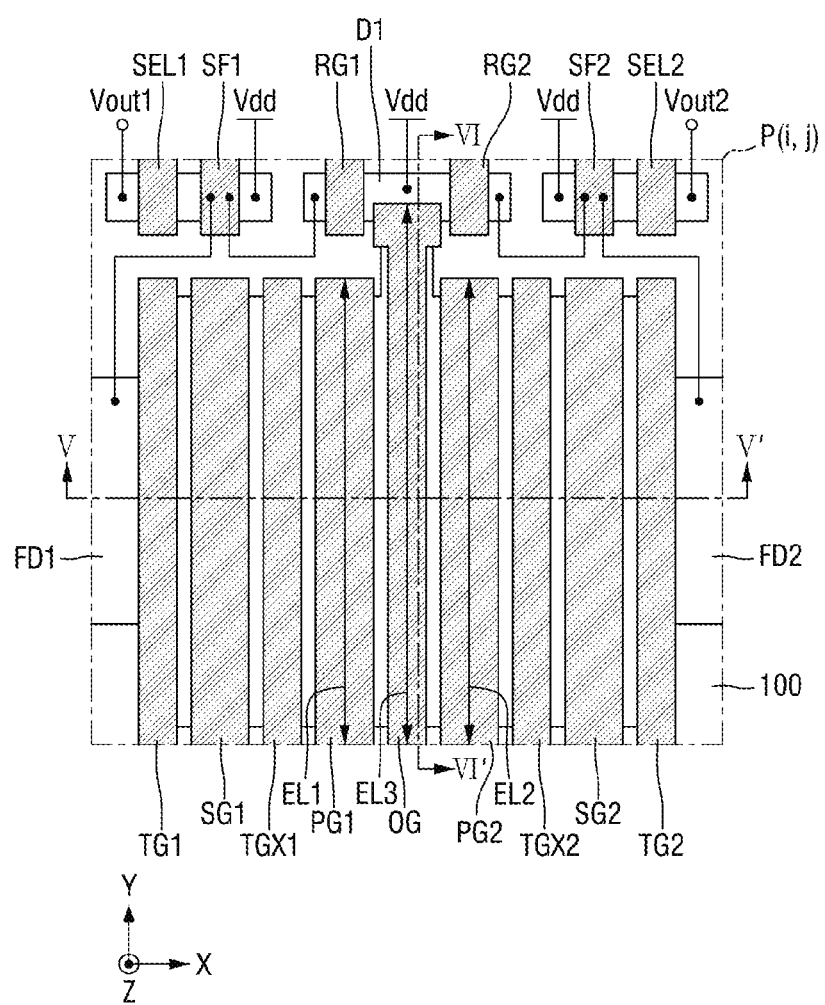
FIG. 4 is an example layout diagram illustrating the first pixel region according to some example embodiments.
Figure 5:
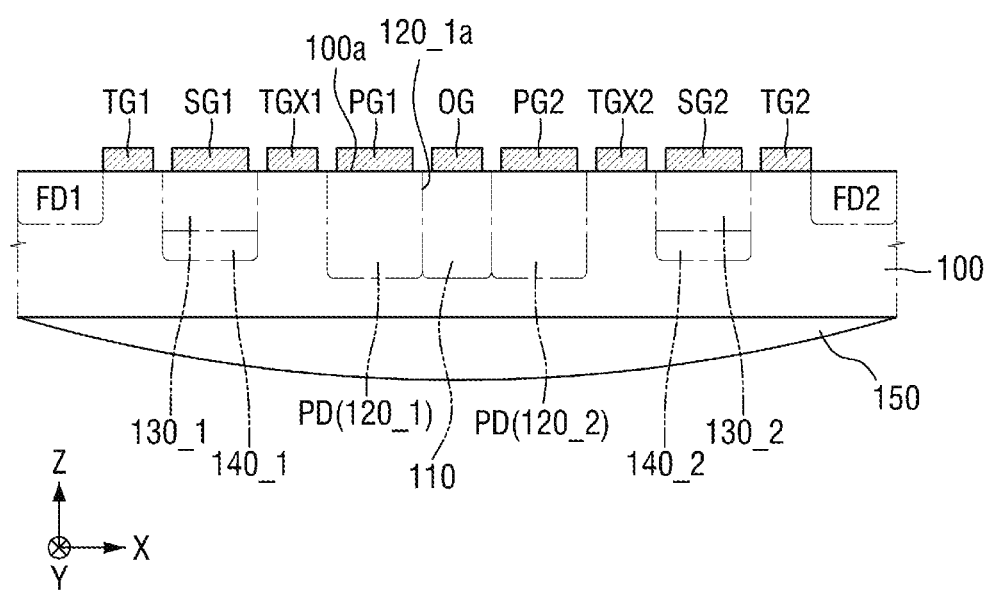
FIG. 5 is an example cross-sectional view taken along line V-V' of FIG. 4.
Figure 6:
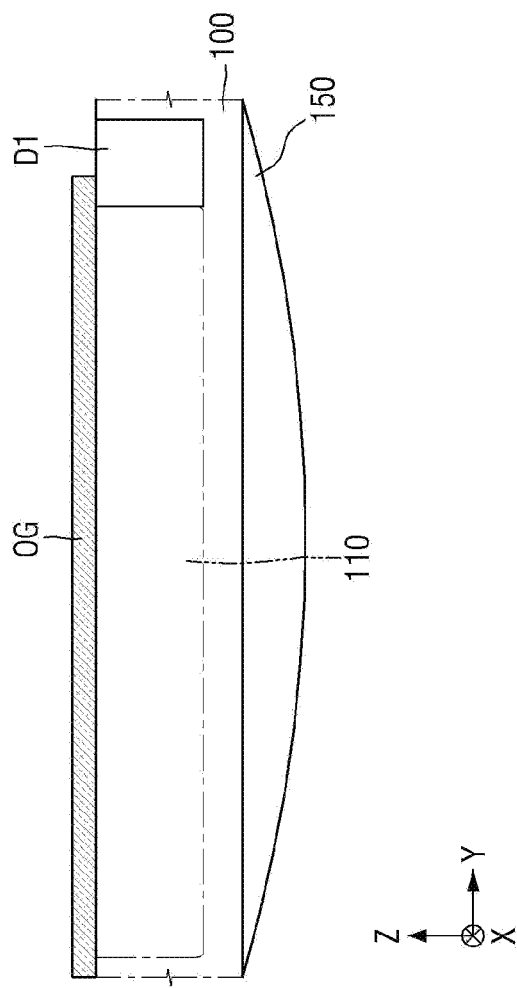
FIG. 6 is an example cross-sectional view taken along line VI-VI' of FIG. 4.

FIG. 3 is an example equivalent circuit diagram of the first pixel region ("pixel") P (i, j) according to some example embodiments. FIG. 4 is an example layout diagram illustrating the first pixel region ("pixel") P (i, j) according to some example embodiments. FIG. 5 is an example cross-sectional view taken along line V-V' of FIG. 4. FIG. 6 is an example cross-sectional view taken along line VI-VI' of FIG. 4.

Referring to FIGS. 3 to 6, the first pixel region P (i, j) may include a substrate 100, a first photo gate PG1, a second photo gate PG2, a first collection charge transmission gate TGX1, a second collection charge transmission gate TGX2, a first storage gate SG1, a second storage gate SG2, a first transmission gate TG1, a second transmission gate TG2, a first reset gate RG1, a second reset gate RG2, a first source follower gate SF1, a second source follower gate SF2, a first selection gate SEL1, a second selection gate SEL2, a first overflow gate OG and a microlens 150. As used herein, the term "gate" may mean a gate of the transistor. For example, the first selection gate SEL1 means the gate of the first selection transistor.

A plurality of gates according to some example embodiments may be formed on a first surface 100a of the substrate 100. The microlens 150 may be formed on a second surface facing the first surface of the substrate 100. However, the embodiments are not limited thereto, and the plurality of gates and the microlens 150 may be formed on the same surface of the substrate 100. In addition, the plurality of gates according to some example embodiments may include an interface film, a gate insulating film and a gate electrode, respectively.

The substrate 100 may be formed, for example, using a p-type or n-type bulk substrate, using the p-type or n-type epitaxial layer grown on a p-type bulk substrate, or using a p-type or n-type epitaxial layer grown on the n-type bulk substrate. However, the embodiments are not limited thereto. For example, the substrate 100 may use a Si bulk substrate, or may also use a substrate such as an organic plastic substrate, in addition to the semiconductor substrate.

The microlens 150 may be made of an organic material such as a PR (Photoresist). However, the present inventive concepts are not limited thereto, and the microlens 150 may be formed, using an inorganic material. Formation of the microlens 150 using the organic material may be, for example, formation of the microlens 150 by forming an organic material pattern on the substrate 100 and performing a thermal process. The organic material pattern may be changed to the form of microlens 150 by the thermal process.

As shown in at least FIGS. 3-4, the first photo gate PG1, the first collection charge transmission gate TGX1, the first storage gate SG1, the first transmission gate TG1, the first reset gate RG1, the first source follower gate SF1 and the first selection gate SEL1 may be disposed symmetrically with the second photo gate PG2, the second collection charge transmission gate TGX2, the second storage gate SG2, the second transmission gate TG2, the second reset gate RG2, the second source follower gate SF2, and the second selection gate SEL2, on the basis of the first overflow gate OG.

According to some example embodiments, and as shown in at least FIG. 4, the first photo gate PG1 and the second photo gate PG2 may be disposed to be spaced apart from each other ("isolated from direct contact with each other") in a second direction X. In some example embodiments, each of the first photo gate PG1 and the second photo gate PG2 may extend in parallel or substantially in parallel (e.g., in parallel within manufacturing tolerances and/or material tolerances) in the first direction Y. For example, the first photo gate PG1 may extend in the first direction Y by a first length EL1. Similarly, the second photo gate PG2 may extend in the first direction Y by a second length EL2. As shown in at least FIG. 4, the second direction X may be orthogonal or substantially orthogonal (e.g., orthogonal within manufacturing tolerances and/or material tolerances) to the first direction Y.

A first charge collection region 120_1 may be formed in the substrate 100 below the first photo gate PG1 along a direction in which the first photo gate PG1 extends, that is, the first direction Y. Accordingly, the first charge collection region 120_1 may be understood to be "on" the first photo gate PG1. Likewise, a second charge collection region 120_2 may be formed in the substrate 100 below the second photo gate PG2 along the first direction Y. Accordingly, the second charge collection region 120_2 may be understood to be "on" the second photo gate PG2. As shown in at least FIG. 5, the first charge collection region 120_1 and the second charge collection region 120_2 may be isolated from direct contact with each other in the second direction X. The first charge collection region 120_1 and the second charge collection region 120_2 may receive light (e.g., the second optical signal L2) from the microlens 150 to generate charge. In other words, the first charge collection region 120_1 and the second charge collection region 120_2 may convert the optical signal received via the microlens 150 (e.g., the second optical signal L2) into an electric signal. In some example embodiments, the first charge collection region 120_1 may at least partially define a photodiode PD, also referred to herein as a first photoelectric device that extends in the first direction Y and is configured to receive an optical signal and convert the optical signal into an electric signal.

As shown in at least FIG. 4, the first overflow gate OG may be between the first photo gate PG1 and the second photo gate PG2 and may extend in the first direction Y between the first photo gate PG1 and the second photo gate PG2 and in parallel or substantially in parallel with the first photo gate PG1 and the second photo gate PG2. In some example embodiments, the first overflow gate OG may extend from the first drain region D1 to cross a region between the first photo gate PG1 and the second photo gate PG2. Restated, the first overlap gate may extend to a first drain region D1. In some example embodiments, the first overflow gate OG may extend in the first direction Y by a third length EL3, such that the first overflow gate OG may be understood to have a total length that is the third length EL3. The first photo gate PG1 may extend in the first direction Y by a first length EL1, such that the first photo gate PG1 may be understood to have a total length that is the first length EL1. The second photo gate PG2 may extend in the first direction Y by a second length EL2, such that the second photo gate PG2 may be understood to have a total length that is the second length EL2. According to some example embodiments, a third length EL3, by which the first overflow gate OG extends in the first direction Y, may be greater than the first length EL1 by which that the first photo gate PG1 extends in the first direction Y and the second length EL2 by which the second photo gate PG2 extends in the first direction Y. Restated, the total length of the first overflow gate OG in the first direction Y (e.g., the third length EL3) may be greater than the total length of the first photo gate PG1 in the first direction Y (e.g., the first length EL1), the total length of the second photo gate PG2 in the first direction Y (e.g., the second length EL2), a sub-combination thereof, or a combination thereof. As shown, the first overflow gate OG may be on a first surface 120_1a of the photodiode PD that is at least partially defined by the charge collection region 120_1.

It will be understood that an element that is "on" another element may be above or below the other element. In addition, an element that is "on" another element may be directly on the other element, such that the elements are in direct contact with each other, or indirectly on the other element, such that one or more interposing elements are located between the elements. For example, the first overflow gate OG may be indirectly on the first surface 120_1a, as shown in at least FIG. 5.

A first channel region 110 may be formed in the substrate 100 below the first overflow gate OG along the direction by which the first overflow gate OG extends, that is, the first direction Y, such that the first channel region 110 is on the first overflow gate OG and is between the first overflow gate OG and a first surface 120_1a of the photodiode PD that is at least partially defined by the first charge collection region 120_1. In some example embodiments, the first channel region 110 may include one or more p-type impurities (p-doped) or may not include p-type impurities (undoped). In some example embodiments, the first channel region 110 may include one or more n-type impurities (n-doped) or may not include n-type impurities (undoped). In the case where the first channel region 110 includes p-type impurities or does not include impurities, the image sensor 90 may adopt an indirect transmission type demodulation. In some example embodiments, when the first channel region 110 includes n-type impurities, the image sensor 90 may adopt a direct transmission type demodulation. The indirect transmission type demodulation and the direct transmission type demodulation will be described below.

In the case where the first channel region 110 includes p-type impurities or does not include impurities, the first channel region 110 may restrict the charge movement between the first charge collection region 120_1 and the second charge collection region 120_2, or may discharge charges stored in the first charge collection region 120_1 and the second charge collection region 120_2 to the first drain region D1, in accordance with the control signal provided to the first overflow gate OG. For example, when a turn-off voltage (e.g., a ground voltage) is applied to the first overflow gate OG, since the energy band of the first channel region 110 is greater than the energy bands of the first charge collection region 120_1 and the second charge collection region 120_2, the first channel region 110 functions as an energy barrier which restricts the charge movement between the first charge collection region 120_1 and the second charge collection region 120_2. In some example embodiments, when a turn-on voltage (e.g., a driving voltage) is applied to the first overflow gate OG, since the energy band of the first channel region 110 is smaller than the energy bands of the first charge collection region 120_1 and the second charge collection region 120_2, the first channel region 110 may receive the charges stored in the first charge collection region 120_1 and the second charge collection region 120_2. The image sensor 90 may be configured to apply a power supply voltage Vdd to the first drain region D1. The charges provided to the first channel region 110 may be discharged to the first drain region D1 to which the power supply voltage Vdd is applied. Therefore, in the equivalent circuit diagram of FIG. 4, when a turn-on voltage (e.g., a driving voltage) is applied to the first overflow gate OG, the switch is short-circuited, and when a turn-off voltage (e.g., a ground voltage) is applied to the first overflow gate OG, the switch may be opened. Accordingly, it will be understood that the first channel region 110 may be configured to selectively block charge movement between the first charge collection region 120_1 and the second charge collection region 120_2 or receive the first charge and the second charge from the first charge collection region and the second charge collection regions 120_1 and 120_2, respectively, based on a signal provided to the first overflow gate OG.

According to some example embodiments, including the example embodiments shown in at least FIGS. 4-6, the entire first photo gate PG1 extending in the first direction Y may overlap at least a part of the first overflow gate OG in the second direction X. Similarly, the entire second photo gate PG2 extending in the first direction Y may overlap at least part of the first overflow gate OG in the second direction X. Thus, as shown in at least FIGS. 4-6, the first overflow gate OG may overlap both the first photo gate PG1 and the second photo gate PG2 in the second direction X. Therefore, the first channel region 110 may be formed between the first charge collection region 120_1 and the second charge collection region 120_2 extending in the first direction Y.

The first collection charge transmission gate TGX1 may be spaced apart from ("isolated from direct contact with") the first photo gate PG1 in the second direction X and may extend in the first direction Y. The first collection charge transmission gate TGX1 may provide the charge generated in the first charge collection region 120_1 to the first storage region 130_1, in accordance with the control signal. Since the second collection charge transmission gate TGX2 is similar to the first collection charge transmission gate TGX1, a description thereof will not be provided. For example, the second collection charge transmission gate TGX2 may be spaced apart from ("isolated from direct contact with") the second photo gate PG2 in the second direction X and may extend in the first direction Y.

As shown in at least FIGS. 4-5, the first storage gate SG1 may be between the first collection charge transmission gate TGX1 and the first transmission gate TG1 and may extend in the first direction Y. The first storage gate SG1 may be spaced apart from the first collection charge transmission gate TGX1 in the second direction X and extend in the first direction Y. A first storage region 130_1 (also referred to herein as a first charge storage region) and a first barrier region 140_1 may be formed in the substrate 100 under ("on") the first storage gate SG1, along a direction in which the first storage gate SG1 extends, that is, the first direction Y. As shown in at least FIG. 5, the first storage region 130_1 may be under ("on") the first collection charge transmission gate TGX1. The first storage region 130_1 may be isolated from direct contact with the first charge collection region 120_1 in the second direction X. The first storage region 130_1 may temporarily store the charge provided from the first charge collection region 120_1 in accordance with the control signal provided to the first storage gate SG1. Restated, the first storage region 130_1 may receive and store the first charge from the first charge collection region 120_1. The first barrier region 140_1 is formed on (e.g., below) the first storage region 130_1 and may block the optical signal provided from the outside of the first storage region 130_1 to minimize external influences of charges stored in the first storage region 130_1. In other words, the first barrier region 140_1 may prevent the first storage region 130_1 from generating charges by an external optical signal. The first barrier region 140_1 according to some example embodiments may include a p-type impurity. The first storage region 130_1 according to some example embodiments may include n-type impurities, but the embodiments are not limited thereto. For example, the first storage region 130_1 may not include an n-type impurity (undoped). In the case where the first storage region 130_1 according to some example embodiments includes an n-type impurity and the first barrier region 140_1 includes a p-type impurity, a first storage 130_1 which is an n-type semiconductor and the first barrier region 140_1 which is a p-type semiconductor may constitute a storage diode (SD).

As shown in at least FIGS. 4-5, the second storage gate SG2 may be between the second collection charge transmission gate TGX2 and the second transmission gate TG2 and may extend in the first direction Y. The second storage gate SG2 may be spaced apart from the second collection charge transmission gate TGX2 in the second direction X and extend in the first direction Y. The second storage region 130_2 (also referred to herein as a second charge storage region) and the second barrier region 140_2 may be formed in the substrate 100 under ("on") the second storage gate SG2. As shown in at least FIG. 5, the second storage region 130_2 may be under ("on") the second collection charge transmission gate TGX2. The second storage region 130_2 may be isolated from direct contact with the second charge collection region 120_2 in the second direction X. The second storage region 130_2 may receive and store the second charge from the second charge collection region 120_2. The second barrier region 140_2 is on (e.g., below) the second storage region 130_2. The second barrier region 140_2 may include a p-type impurity. Since the second storage gate SG2, the second storage region 130_2 and the second barrier region 140_2 are similar to the first storage gate SG1, the first storage region 130_1 and the first barrier region 140_1, respectively, the description thereof will not be provided.

In some example embodiments, some of the first collection charge transmission gate TGX1, the second collection charge transmission gate TGX2, the first storage gate SG1 and the second storage gate SG2 may be omitted. Those having ordinary skill in the technical field of the present inventive concepts may implement the technical idea of the present inventive concepts, while omitting at least some of the first collection charge transmission gate TGX1, the second collection charge transmission gate TGX2, the first storage gate SG1 and the second storage gate SG2.

The first transmission gate TG1 may be spaced apart from ("isolated from direct contact with") the first storage gate SG1 in the second direction X and may extend in the first direction Y. The first transmission gate TG1 may be spaced apart from ("isolated from direct contact with") the first collection charge transmission gate TGX1 in the second direction X and may extend in the first direction Y. The first transmission gate TG1 may supply the charge temporarily stored in the first storage region 130_1 to the first floating diffusion region FD1. The charge provided to the first floating diffusion region FD1 may be output to the first output voltage Vout1 via the first source follower gate SF1 and the first selection gate SEL1. Accordingly, it will be understood that the first floating diffusion region FD1 may be configured to receive a first charge from the first charge collection region 120_1 and to output the first charge. The first reset gate RG1 may reset the first floating diffusion region FD1 to the power supply voltage Vdd.

The second transmission gate TG2 may be spaced apart from the second storage gate SG2 in the second direction X and extend in the first direction Y. The second transmission gate TG2 may be spaced apart from ("isolated from direct contact with") the second collection charge transmission gate TGX2 in the second direction X and may extend in the first direction Y. The second transmission gate TG2 may supply the charge temporarily stored in the second storage region 130_2 to the second floating diffusion region FD2. The charge provided to the second floating diffusion region FD2 may be output to the second output voltage Vout2 via the second source follower gate SF2 and the second selection gate SEL2. Accordingly, it will be understood that the second floating diffusion region FD2 may be configured to receive a second charge from the second charge collection region 120_2 and to output the second charge. The second reset gate RG2 may reset the second floating diffusion region FD2 to the power supply voltage Vdd. According to some example embodiments, it is illustrated that the same power supply voltage Vdd is applied to the first drain region D1, the drains of the first source follower gate SF1 and the second source follower gate SF2, and the drains of the first reset gate RG1 and the second reset gate RG2, but the embodiments are not limited thereto. In some cases, different voltages may be applied to the first drain region D1, the drains of the first source follower gate SF1 and the second source follower gate SF2, and the drains of the first reset gate RG1 and the second reset gate RG2. The aforementioned indirect transmission type demodulation and direct transmission type demodulation will be described referring to FIGS. 7 to 8.

Figure 7:
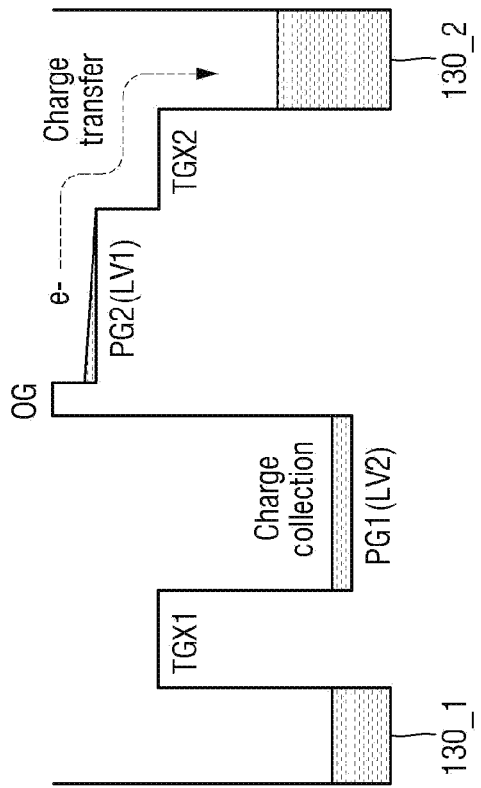
FIG. 7 is an example diagram for explaining the indirect transmission type demodulation.
Figure 8:
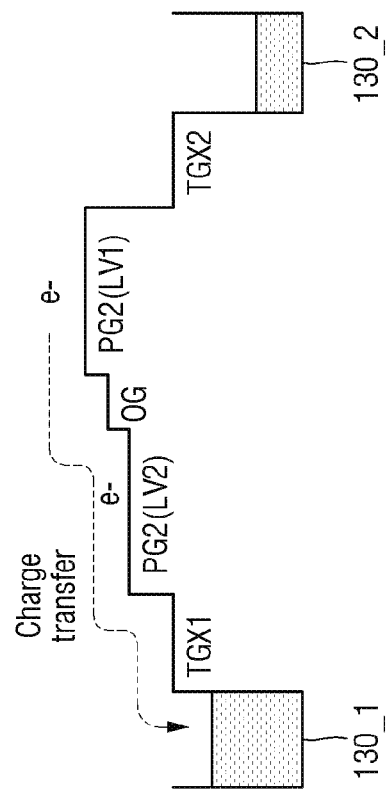
FIG. 8 is an example diagram for explaining the direct transmission type demodulation.

FIG. 7 is an example diagram for explaining the indirect transmission type demodulation. FIG. 8 is an example diagram for explaining the direct transmission type demodulation.

Referring to FIGS. 5 and 7, when the voltage of the first photo gate PG1 is a logic high level LV2, the energy band of the first charge collection region 120_1 may be smaller than the energy band of a lower region of the first collection charge transmission gate TGX1, and the energy band of a lower part of the first overflow gate OG, that is, the first channel region 110. Therefore, the first charge collection region 120_1 attracts and stores the charges generated in the region and the peripheral region, while the first photo gate PG1 is at the logic high level LV2. In some example embodiments, when the voltage of the second photo gate PG2 is at the logic low level LV1, the energy band of the second charge collection region 120_2 may be greater than the energy band of the lower region of the second collection charge transmission gate TGX2, and may be smaller than the energy band of the first channel region 110. Therefore, the charges stored in the second charge collection region 120_2 are transmitted to the second storage region 130_2. Therefore, while the second photo gate PG2 is at the logic low level LV1, the second charge collection region 120_2 transmit the charges stored in the second charge collection region 120_2 to the second storage region 130_2. At this time, regardless of the voltages applied to the first photo gate PG1 and the second photo gate PG2, since the energy bands of the first charge collection region 120_1 and the second charge collection region 120_2 are smaller than the energy band of the first channel region 110, the first channel region 110 may restrict the charge movement between the first charge collection region 120_1 and the second charge collection region 120_2. Similarly, when voltage of the logic low level LV1 is applied to the first photo gate PG1 and voltage of the logic high level LV2 is applied to the second photo gate PG2, the charge stored in the first charge collection region 120_1 is transmitted to the first storage region 130_1, and the second charge collection region 120_2 starts the charge collection. When the first channel region 110 according to some example embodiments includes p-type impurities or does not include impurities, since the energy band of the first channel region 110 is relatively large, it is possible to restrict the charge movement between the first charge collection region 120_1 and the second charge collection region 120_2.

Referring to FIGS. 5 and 8, when the voltage of the first photo gate PG1 is a logic high level LV2 and the voltage of the second photo gate PG2 is a logic low level LV1, the energy band is reduced in the order of the second charge collection region 120_2, the first channel region 110 and the first charge collection region 120_1. Therefore, the charge generated in the first charge collection region 120_1 and the second charge collection region 120_2 may be immediately transmitted to and stored in the first storage region 130_1. In the case where the first channel region 110 according to some example embodiments includes the n-type impurities, since the energy band of the first channel region 110 is relatively small, the direct transmission type demodulation may be enabled.

Figure 9:
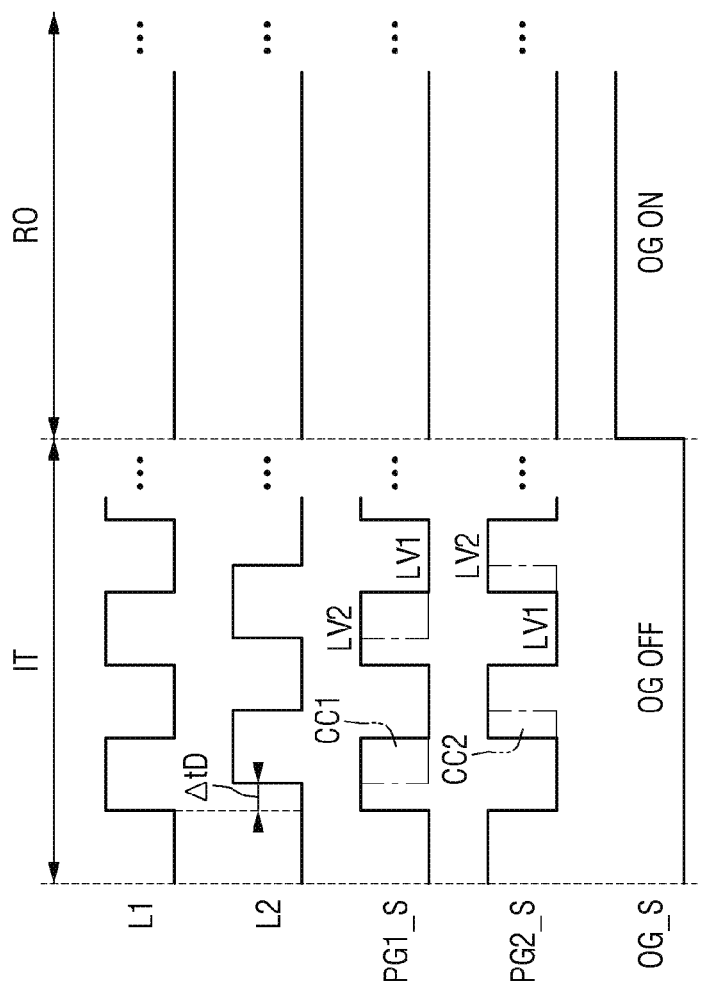
FIG. 9 is an example timing diagram illustrating signals for driving the first pixel region according to some example embodiments.

FIG. 9 is an example timing diagram illustrating signals for driving the first pixel region (e.g., pixel P(i, j)) according to some example embodiments.

Referring to FIGS. 1, 3, and 9, the light emitter 400 of the distance measuring sensor 1 may generate the first optical signal L such that the light emitter 400 irradiates an object O with the first optical signal L1. The first optical signal L1 irradiated to the object O and reflected from the object O as the second optical signal L2 may be provided to (e.g., incident on) the pixel array 10 of the image sensor 90 as the second optical signal L2. At this time at which the pixel array 10 receives the second optical signal L2 (e.g., concurrently therewith), a section in which the pixel array 10 receives the second optical signal L2, which may be one or more particular pixels (e.g., P(i, j)) of the pixel array 10, is defined as a first section IT, and a section in which the readout circuit 70 receives the electrical output signal (e.g., a first output voltage Vout1 and a second output voltage Vout2) of the pixel array 10 to measure the distance between the light emitter 400 and the object O is defined as a second section RO, which may be one or more separate pixels (e.g., P(i, j+1)) of the pixel array 10 that are different from the one or more particular pixels of the first section IT, such that the readout circuit 70 is configured to calculate a distance between the light emitter 400 and the object O. Further, a signal provided to the first photo gate PG1 is defined as a first signal PG1_S, a signal provided to the second photo gate PG2 is defined as a second signal PG2_S, and a signal provided to the first overflow gate OG is defined as a gate driving signal OG_S.

In the first section IT, the light emitter 400 may output ("generate," "emit," or the like) the first optical signal L1. The first optical signal L1 may be a pulse signal in which the signal intensity (e.g., the intensity of the light emitted by the light emitter 400) changes over time. For example, the first optical signal L1 may be an optical signal in which an on-off time pattern of light intensity (e.g., a binary pattern, a rectangular wave pattern, some combination thereof, or the like) is repeated over time. Restated, the first optical signal L2 may be an "on-off signal." In the first section IT, the pixel array 10 may receive the second optical signal L2. The second optical signal L2 may be the first optical signal L1 delayed by a first delay time ΔtD (e.g., having a time offset). The first delay time ΔtD may correspond to an optical time of flight (ToF). Although the first optical signal L and the second optical signal L2 are illustrated as having rectangular waves in the drawings, the example embodiments are not limited thereto. For example, the first optical signal L1 and the second optical signal L2 may be sinusoidal waves. In some example embodiments, the first optical signal L1 and the second optical signal L2 are illustrated as having the same amplitude in the drawings, the example embodiments are not limited thereto. In some example embodiments, the first optical signal L1 and the second optical signal L2 may have different amplitudes and may have a DC offset value.

As shown in FIG. 9, in the first section IT, the timing generator 20 may generate a first signal PG1_S having a same phase as the phase of the first optical signal L using ("based on") the information associated with the first optical signal L1, and may supply ("provide") the generated first signal PG1_S to the first photo gate PG1. As further shown in FIG. 9, the timing generator 20 may generate a second signal PG2_S having a phase opposite to the phase of the first optical signal L1 based on the information associated with the first optical signal L1, and may provide the generated second signal PG2_S to the second photo gate PG2. Restated, It will be understood that the timing generator 20 may generate both the first signal PG1_S and the second signal PG2_S based on the information associated with the first optical signal L1, for example such that the first signal PG1_S has the same phase as the first optical signal L1 and the second signal PG2_S has the phase opposite to the phase of the first optical signal L1, and the timing generator 20 may provide the first signal PG1_S and the second signal PG2_S to the pixel array 10, based on information of associated with the first optical signal L1, such that the timing generator 20 provides the first signal PG1_S to the first photo gate PG1 (e.g., a first photo gate PG1 of the first section IT), for example to control the first photo gate PG1, and the timing generator 20 provides the second signal PG2_S to the second photo gate PG2 (e.g., a second photo gate PG2 of the first section IT), to control the second photo gate PG2. In some example embodiments, a phase difference between the first signal PG1_S and the second signal PG2_S may be 180°. For example, when the first signal PG1_S is at a logic low level LV1, the second signal PG2_S may be at a logic high level LV2. Further, when the first signal PG1_S is at a logic high level LV2, the second signal PG2_S may be at a logic low level LV1. It will be understood that the timing generator 20 may be configured to not provide either the first signal PG1_S or the second signal PG2_S to the second section RO of the pixel array 10, for example concurrently with the timing generator 20 providing the first and second signals to the first section IT of the pixel array 10 (e.g., the first and second photo gates PG1 and PG2 of the pixel array 10, respectively).

When the signals provided to the first photo gate PG1 and the second photo gate PG2 are at a logic high level LV2, each of the first charge collection region 120_1 and the second charge collection region 120_2 converts the second optical signal L2 received at the respective charge collection region 120_1 and 120_2 into an electric signal. In other words, when the first signal PG1_S provided to the first photo gate PG1 is at a logic high level LV2 and the second optical signal L2 is received at the pixel array 10, the first charge collection region 120_1 may generate charge. That is, the amount of charges generated by the first charge collection region 120_1 may correspond to the first charge generation section CC 1. Similarly, when the second signal PG2_S provided to the second photo gate PG2 is at a logic high level LV2, the second charge collection region 120_2 may receive the second optical signal L2 to generate the charge. In other words, when the second signal PG2_S provided to the second photo gate PG2 is at a logic high level LV2 and the second optical signal L2 is received at the pixel array 10, the second charge collection region 120_2 may generate charge. That is, the amount of charges generated by the second charge collection region 120_2 may correspond to the second charge generation section CC2.

According to some example embodiments, the timing generator 20 may provide a gate driving signal OG_S to the first overflow gate OG, where the gate driving signal OG_S may be a binary signal, also referred to herein as an "on-off signal." For example, the timing generator 20 may provide a turn-off voltage (e.g., a ground voltage), which may be referred to herein as an "off signal", to the first overflow gate OG in the first section IT (e.g., a particular first overflow gate OG in the first section IT), and may provide a turn-on voltage (e.g., a driving voltage), which may be referred to herein as an "on signal", to the first overflow gate OG in the second section RO (e.g., a separate first overflow gate OG in the second section RO). In the first section IT, since the turn-off voltage (e.g., the ground voltage) is constantly provided to the first overflow gate OG, the first channel region 110 may effectively restrict the charge movement between the first charge collection region 120_1 and the second charge collection region 120_2. In some example embodiments, when a turn-on voltage (e.g., the driving voltage) is provided to the first overflow gate OG in the second section RO, the first channel region 110 receives the charge from the first charge collection regions 120_1 and the second charge collection region 120_2 and may discharge the charge to the first drain region D1 to which the power supply voltage Vdd is applied.

Figure 10:
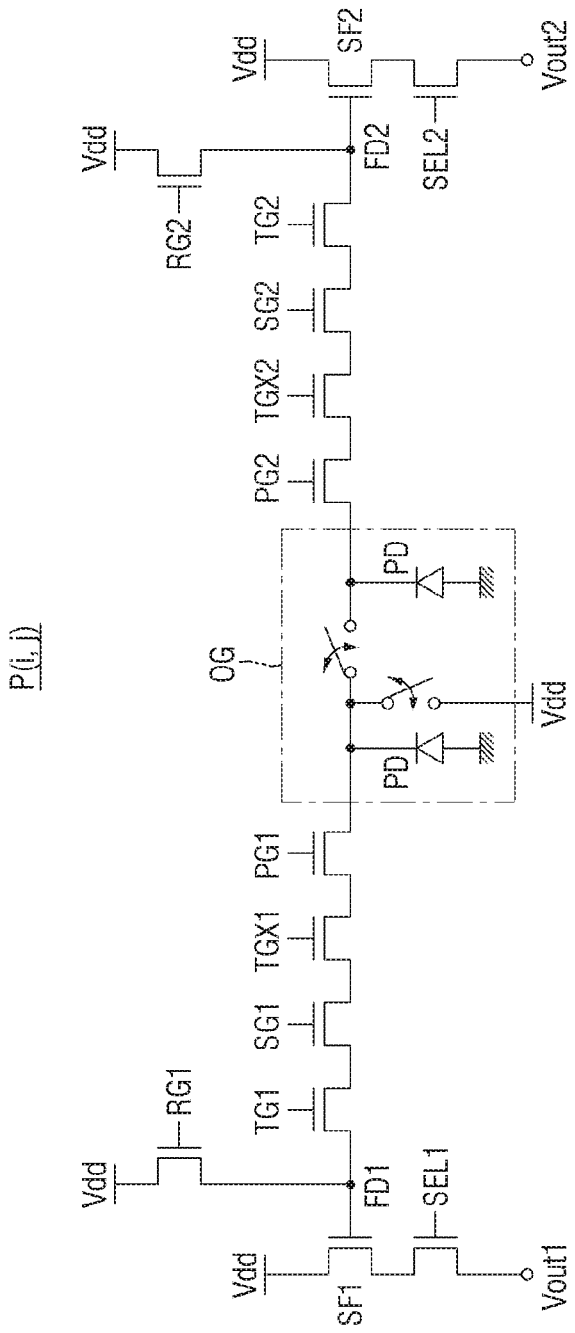
FIG. 10 is an example equivalent circuit diagram of the first pixel region according to some example embodiments.
Figure 11:
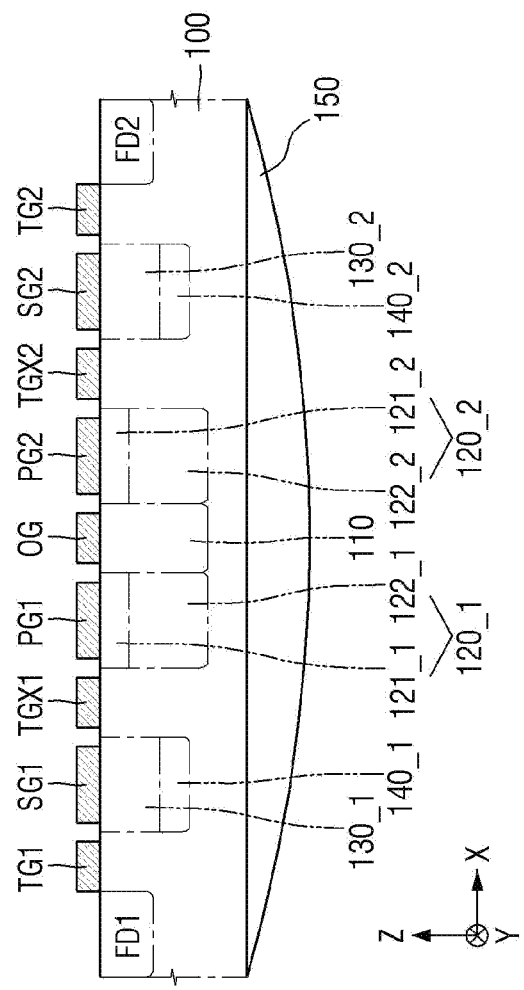
FIG. 11 is an example cross-sectional view taken along line V-V' of FIG. 4.

FIG. 10 is an example equivalent circuit diagram of the first pixel region according to some example embodiments. FIG. 11 is an example cross-sectional view taken along line V-V' of FIG. 4. For the sake of convenience of explanation, repeated or similar contents of the aforementioned contents will be omitted or briefly explained.

Referring to FIGS. 4, 10, and 11, a photodiode PD may be included in the lower substrate 100 of each of the first photo gate PG1 and the second photo gate PG2. For example, the first charge collection region 120_1 may include a first p-type semiconductor region 121_1 and a first n-type semiconductor region 122_1. For example, the first p-type semiconductor region 121_1 may be disposed on the first n-type semiconductor regions 122_1. According to some example embodiments, the first p-type semiconductor region 121_1 and the first n-type semiconductor region 122_1 may constitute a photodiode PD, which may be referred to herein as a first photoelectric device. Similarly, the second charge collection region 120_2 may include a second p-type semiconductor region 121_2 and a second n-type semiconductor region 122_2. The second p-type semiconductor region 121_2 and the second n-type semiconductor region 122_2 may constitute a photodiode PD. In other words, each of the first charge collection region 120_1 and the second charge collection region 120_2 may be constituted by the photodiode PD. Restated, each charge collection region of the first charge collection region 120_1 and the second charge collection region 120_2 may include a first region including an n-type impurity (e.g., first n-type semiconductor regions 122_1 and 122_2) and a second region on the first region, where the second region includes a p-type impurity (e.g., first p-type semiconductor regions 121_1 and 121_2).

Figure 12:
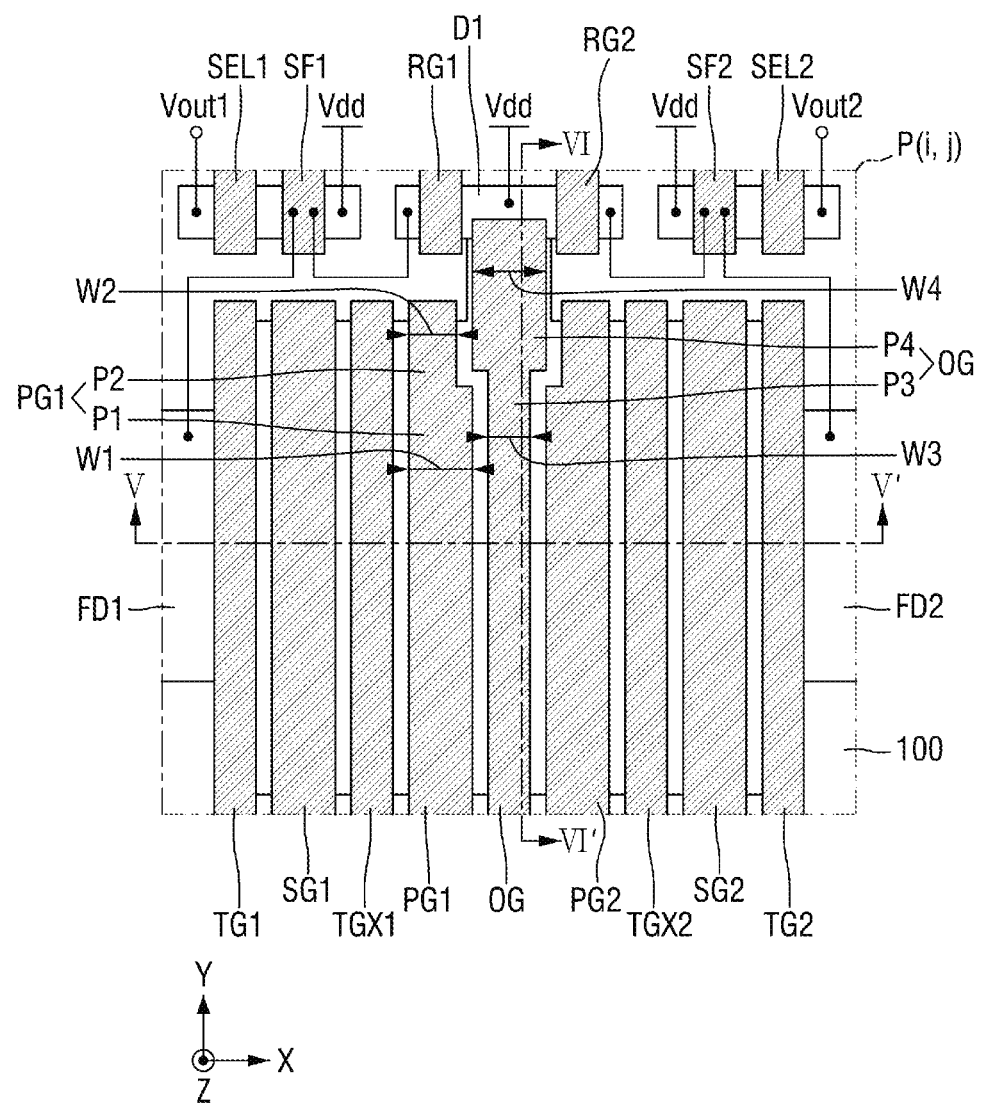
FIG. 12 is an example layout diagram for describing the first pixel region according to some example embodiments.

FIG. 12 is an example layout diagram for describing the first pixel region according to some example embodiments. For the sake of convenience of explanation, repeated or similar contents of the aforementioned contents will be omitted or briefly explained.

Referring to FIG. 12, the first photo gate PG1 includes a first portion P1 having a first width W1 in a second direction X, and a second portion P2 having a second width W2 in the second direction X. The first width W1 may be different (e.g., greater or smaller) than the second width W2. The first overflow gate OG may include a third portion P3 having a third width W3 in the second direction X, and a fourth portion P4 having a fourth width W4 in the second direction X. The third width W3 may be different (e.g., greater or smaller) than the fourth width W4. The first portion P1 of the first photo gate PG1 may overlap the third portion P3 of the first overflow gate OG in the second direction X. The second portion P2 of the first photo gate PG1 may overlap the fourth portion P4 of the first overflow gate OG in the second direction X. In other words, the width of the first overflow gate OG in the second direction X may widen as the first overflow gate OG extends toward the first drain region D1. In contrast, the width of the first photo gate PG1 in the second direction X may be narrowed as the first photo gate PG1 extends toward the first drain region D1. Since the first overflow gate OG has a relatively wide width in the region adjacent to the first drain region D1, the drain performance may be improved. The cross-sectional view taken along V-V' of FIG. 12 may be similar to FIG. 5 or 11. In some example embodiments, the cross-sectional view taken along VI-VI' of FIG. 12 may be similar to FIG. 6.

Figure 13:
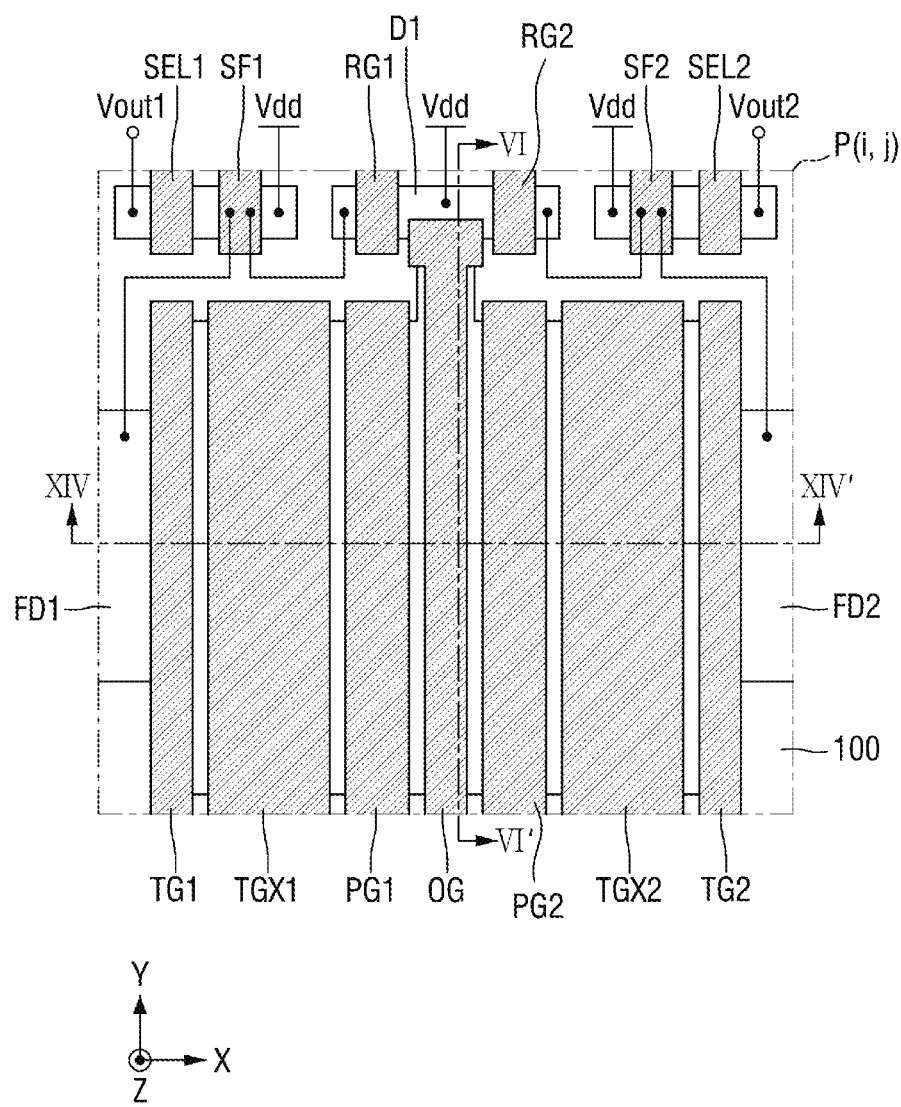
FIG. 13 is an example layout diagram for describing the first pixel region according to some example embodiments.
Figure 14:
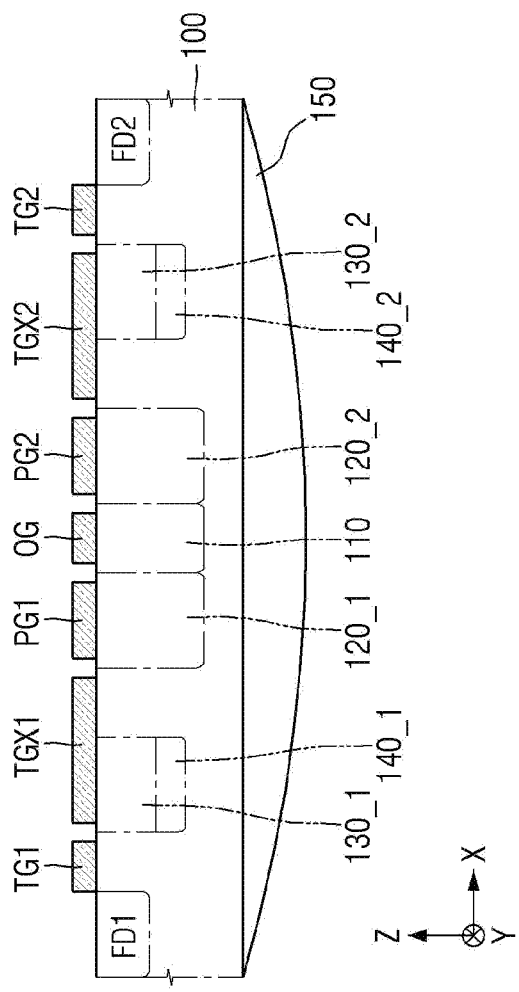
FIG. 14 is an example cross-sectional view taken along line XIV-XIV' of FIG. 13.

FIG. 13 is an example layout diagram for describing the first pixel region according to some example embodiments. FIG. 14 is an example cross-sectional view taken along line XIV-XIV' of FIG. 13. For the sake of convenience of explanation, repeated or similar contents of the aforementioned contents will be omitted or briefly explained.

Referring to FIGS. 13 and 14, the first storage gate SG1 and the second storage gate SG2 may be omitted in the first pixel region P (i, j). According to some example embodiments, the first storage region 130_1 and the first barrier region 140_1 may be disposed under the first collection charge transmission gate TGX1. Likewise, the second storage region 130_2 and the second barrier region 140_2 may be disposed under the second collection charge transmission gate TGX2. Since explanations of the first storage region 130_1, the first barrier region 140_1, the second storage region 130_2 and the second barrier region 140_2 of FIG. 14 are similar to the contents of those described above, the explanation thereof will not be provided.

Figure 15:
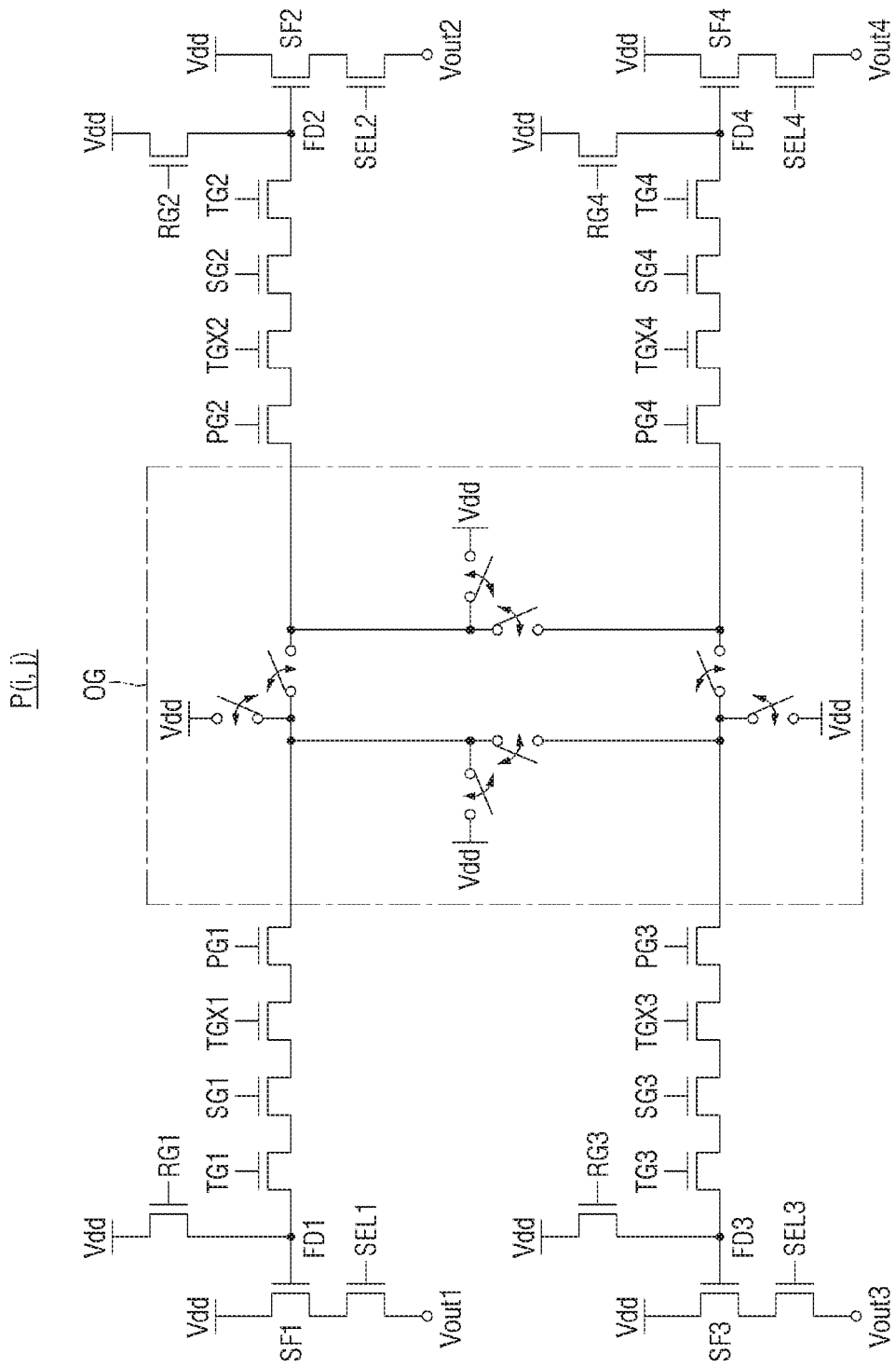
FIG. 15 is an example equivalent circuit diagram of the first pixel region according to some example embodiments.
Figure 16:
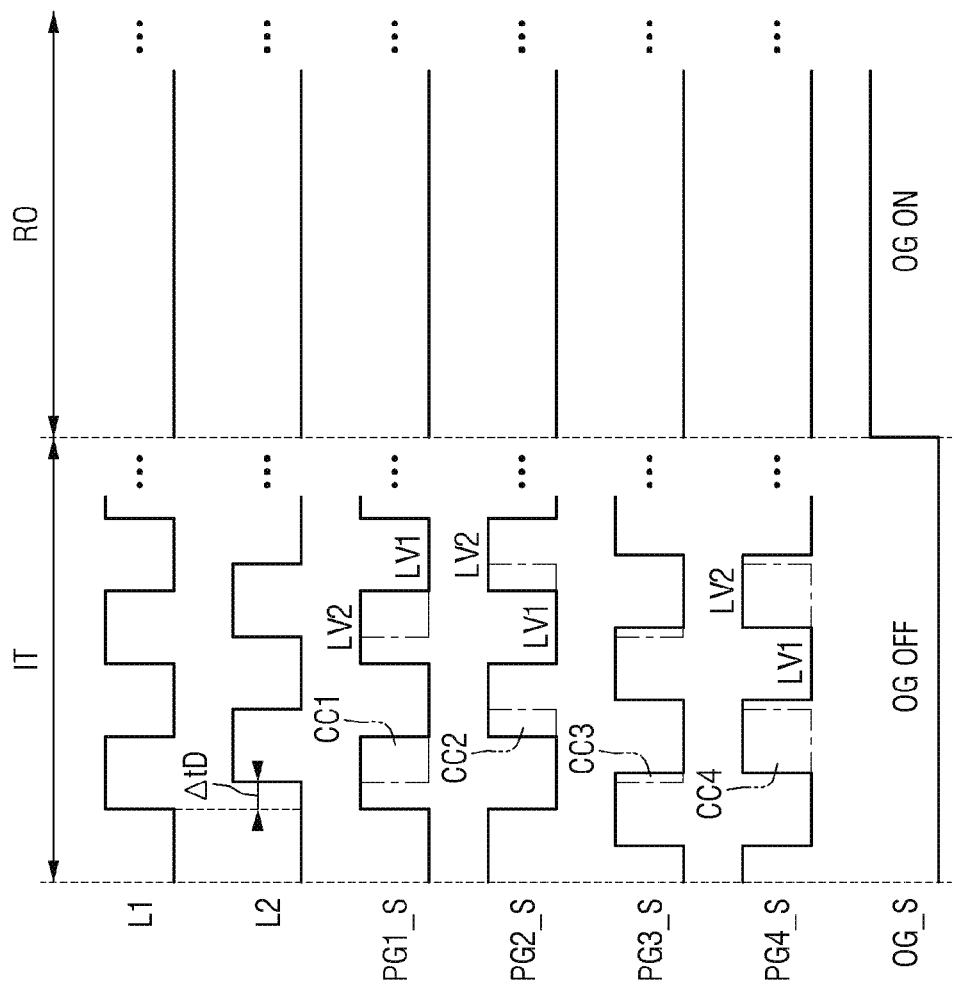
FIG. 16 is an example timing diagram illustrating signals for driving the first pixel region according to some example embodiments.
Figure 17:
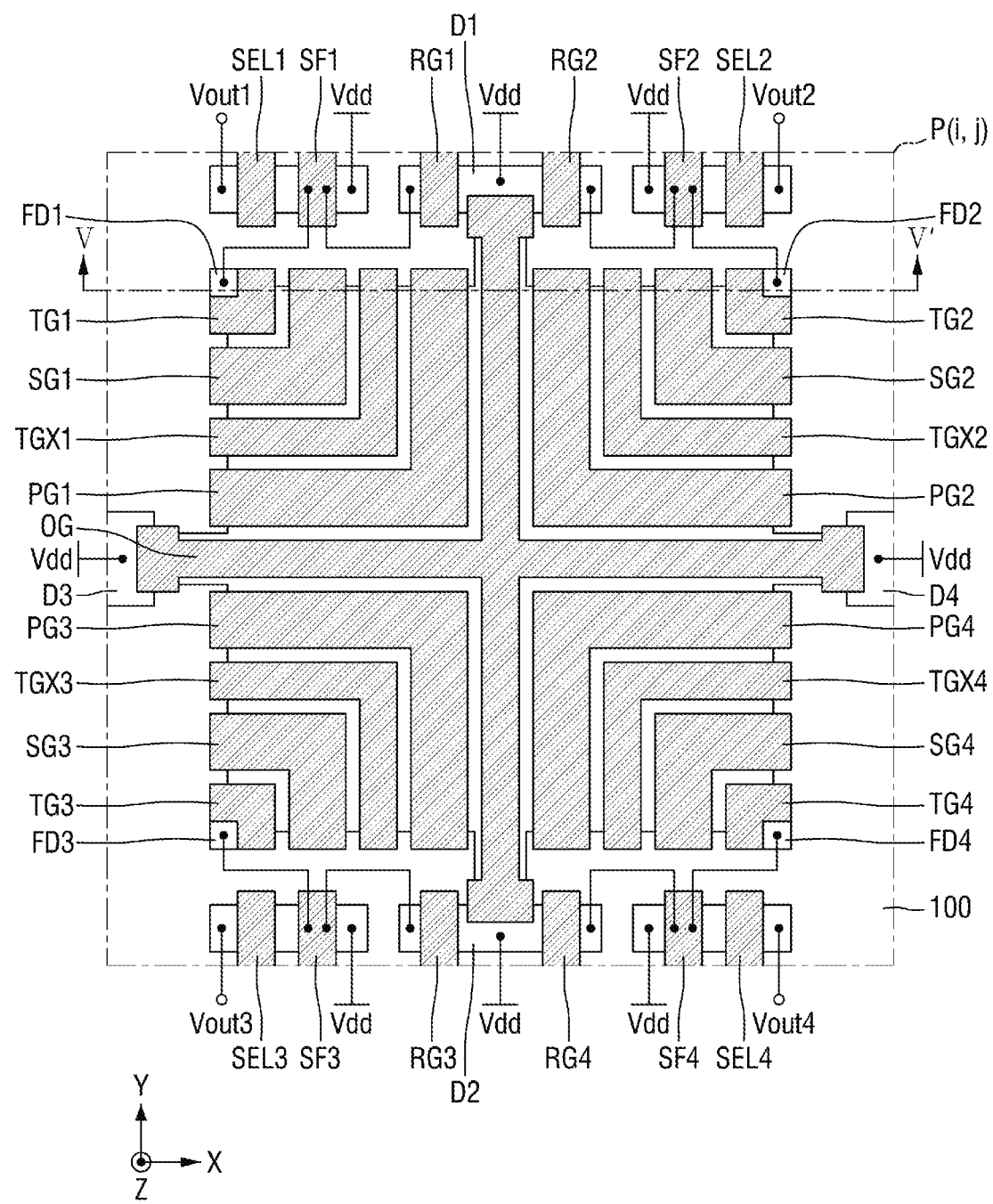
FIG. 17 is an example layout diagram for describing the first pixel region according to some example embodiments.

FIG. 15 is an example equivalent circuit diagram of the first pixel region according to some example embodiments. FIG. 16 is an example timing diagram illustrating signals for driving the first pixel region according to some example embodiments. FIG. 17 is an example layout diagram for describing the first pixel region according to some example embodiments. For the sake of convenience of explanation, repeated or similar contents of the aforementioned contents will be omitted or briefly explained.

Referring to FIGS. 15 to 17, a first pixel region P (i, j) according to some example embodiments may include a substrate 100, a first photo gate PG1, a second photo gate PG2, a third photo gate PG3, a fourth photo gate PG4, a first collection charge transmission gate TGX1, a second collection charge transmission gate TGX2, a third collection charge transmission gate TGX3, a fourth collection charge transmission gate TGX4, a first storage gate SG1, a second storage gate SG2, a third storage gate SG3, a fourth storage gate SG4, a first transmission gate TG1, a second transmission gate TG2, a third transmission gate TG3, a fourth transmission gate TG4, a first reset gate RG1, a second reset gate RG2, a third reset gate RG3, a fourth reset gate RG4, a first source follower gate SF1, a second source follower gate SF2, a third source follower gate SF3, a fourth source follower gate SF4, a first selection gate SEL1, a second selection gate SEL2, a third selection gate SEL3, a fourth selection gate SEL4, and a first overflow gate OG.

The first signal PG1_S, the second signal PG2_S, the third signal PG3_S and the fourth signal PG4_S may be provided to the first photo gate PG1, the second photo gate PG2, the third photo gate PG3, and the fourth photo gate PG4, respectively. For example, the timing generator 20 may generate the first signal PG1_S having the same phase as a phase of the first optical signal L1, the second signal PG2_S having a phase opposite to the phase of the first optical signal L1, the third signal PG3_S having a phase difference of 90° from the phase of the first optical signal L1, and the fourth signal PG4_S having a phase difference of 270° from the phase of the first optical signal L1, using the information associated with the first optical signal L1. The timing generator 20 may provide the first signal PG1_S to the fourth signal PG4_S to each of the first photo gate PG1 to the fourth photo gate PG4. At this time, the amount of charges generated from the lower part of each of the first photo gate PG1 to the fourth photo gate PG4 may correspond to the first charge generation section CC1, the second charge generation section CC2, the third charge generation section CC3 and the fourth charge generation section CC4, respectively.

The first photo gate PG1, the second photo gate PG2, the third photo gate PG3 and the fourth photo gate PG4 are spaced apart from each other ("isolated from direct contact with each other") and may extend in the second direction X and the first direction Y, respectively. For example, the first photo gate PG1 and the second photo gate PG2 may be spaced apart from each other in the second direction X. In some example embodiments, the third photo gate PG3 and the fourth photo gate PG4 may be spaced apart from each other in the second direction X. In addition, the first photo gate PG1 and the third photo gate PG3 may be spaced apart from each other in the first direction Y. Further, the second photo gate PG2 and the fourth photo gate PG4 may be spaced apart from each other in the first direction Y. The third photo gate PG3 may extend in both the first direction Y and the second direction X, and the fourth photo gate PG4 may extend in both the first direction Y and the second direction X. As further shown, the first photo gate PG1 may extend in both the first direction Y and the second direction X, and the second photo gate PG2 may extend in both the first direction Y and the second direction X.

The first overflow gate OG may extend between the first photo gate PG1, the second photo gate PG2, the third photo gate PG3 and the fourth photo gate PG4, such that the first overflow gate OG extends between the first photo gate PG1 and the second photo gate PG2, between the first photo gate PG1 and the third photo gate PG3, between the second photo gate PG2 and the fourth photo gate PG4, and between the third photo gate PG3 and the fourth photo gate PG4. As shown, the first overflow gate OG may extend in both the first direction Y and the second direction X. For example, the first overflow gate OG may extend from the first drain region D1 to the second drain region D2 in the first direction Y, between the first photo gate PG1 and the second photo gate PG2, and between the third photo gate PG3 and the fourth photo gate PG4. In addition, the first overflow gate OG may extend from the third drain region D3 to the fourth drain region D4 in the second direction X, between the first photo gate PG1 and the third photo gate PG3, and between the second photo gate PG2 and the fourth photo gate PG4. A power supply voltage Vdd may be applied to each of the first drain region D1 to the fourth drain region D4.

The charge provided to the third floating diffusion region FD3 may be output to the third output voltage Vout3 via the third source follower gate SF3 and the third selection gate SEL3. The third reset gate RG3 may reset the third floating diffusion region FD3 to the power supply voltage Vdd. The charge provided to the fourth floating diffusion region FD4 may be output to the fourth output voltage Vout4 via the fourth source follower gate SF4 and the fourth selection gate SEL4. The fourth reset gate RG4 may reset the fourth floating diffusion region FD4 to the power supply voltage Vdd. The cross-sectional view taken along V-V' of FIG. 17 may be similar to FIG. 5 or FIG. 11.

Figure 18:
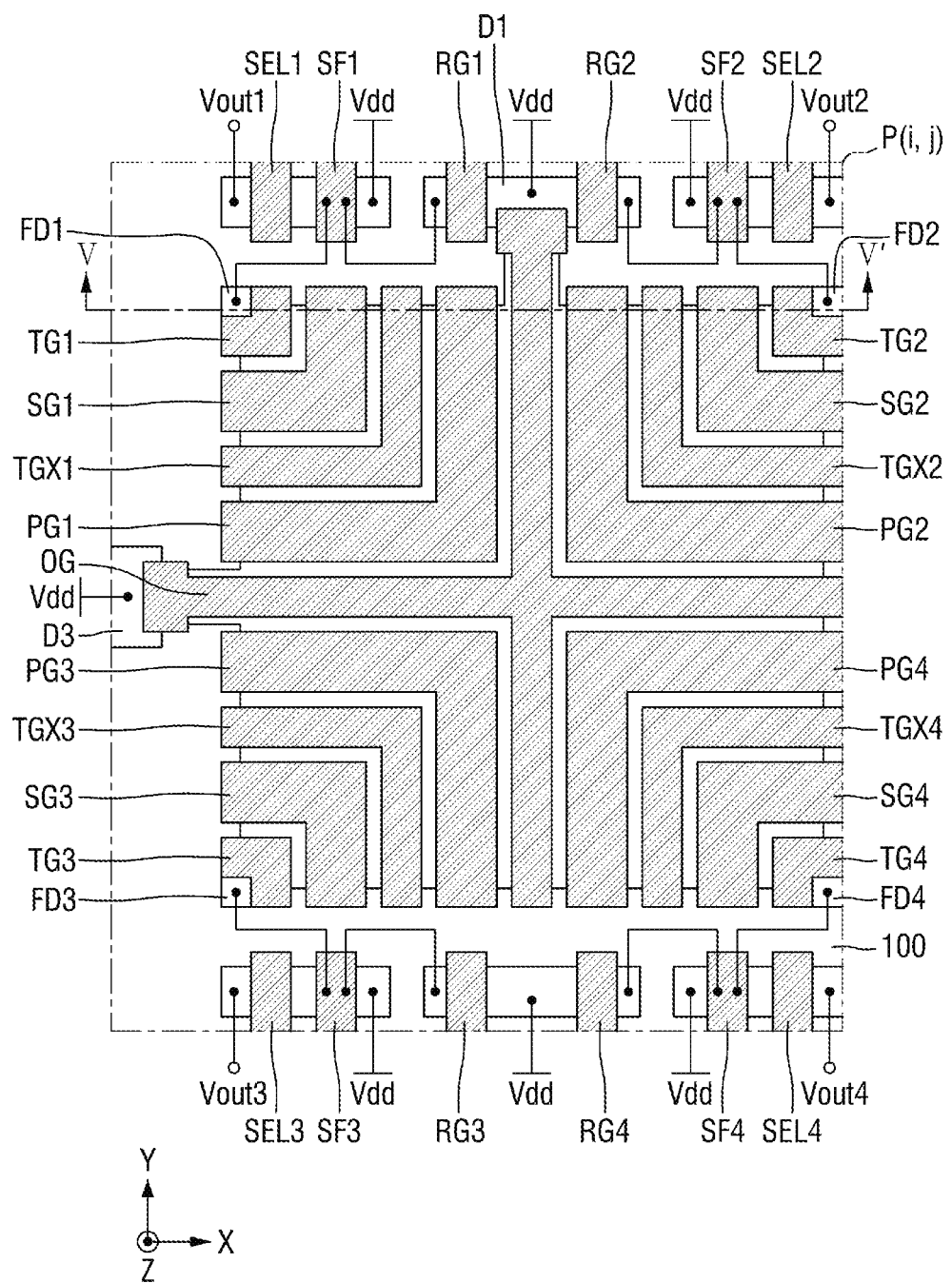
FIG. 18 is an example layout diagram for describing the first pixel region according to some example embodiments.

FIG. 18 is an example layout diagram for describing the first pixel region according to some example embodiments. For the sake of convenience of explanation, repeated or similar contents of the aforementioned contents will be omitted or briefly explained.

Referring to FIGS. 15, 16 and 18, the first overflow gate OG may extend between the first photo gate PG1, the second photo gate PG2, the third photo gate PG3 and the fourth photo gate PG 4. For example, the first overflow gate OG may extend from the first drain region D1 in the first direction Y, between the first photo gate PG1 and the second photo gate PG2, and between the third photo gate PG3 and the fourth photo gate PG4. In addition, the first overflow gate OG may extend from the third drain region D3 in the second direction X, between the first photo gate PG1 and the third photo gate PG3, and between the second photo gate PG2 and the fourth photo gate PG4. The power supply voltage Vdd may be applied to each of the first drain region D1 and the third drain region D3. The cross-sectional view taken along V-V' of FIG. 18 may be similar to FIG. 5 or FIG. 11.

Figure 19:
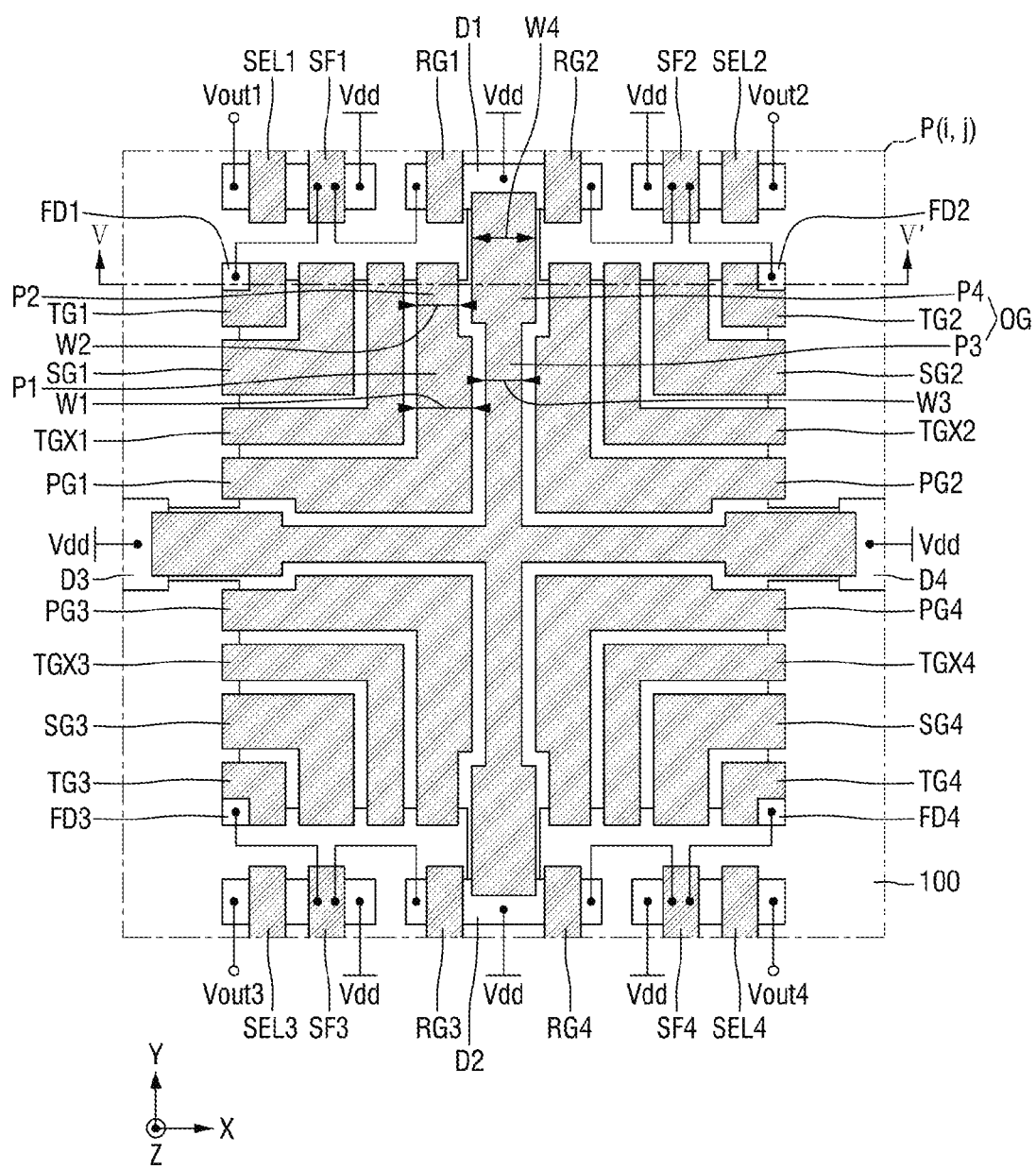
FIG. 19 is an example layout diagram for describing the first pixel region according to some example embodiments.

FIG. 19 is an example layout diagram for describing the first pixel region according to some example embodiments. For the sake of convenience of explanation, repeated or similar contents of the aforementioned contents will be omitted or briefly explained.

Referring to FIGS. 15, 16 and 19, the first photo gate PG1 may include a first portion P1 having a first width W1 in the second direction X, and a second portion P2 having a second width W2 in the first portion X. At this time, the first width W1 is larger than the second width W2. The first overflow gate OG may include a third portion P3 having a third width W3 in the second direction X, and a fourth portion P4 having a fourth width W4 in the second direction X. At this time, the third width W3 is smaller than the fourth width W4. The fourth portion P4 of the first overflow gate OG may overlap the second portion P2 of the first photo gate PG1 in the second direction X. The third portion P3 of the first overflow gate OG may overlap the first portion P1 of the first photo gate PG1 in the second direction X. The second photo gate PG2 through the fourth photo gate PG4 may be similar to the first photo gate PG1. The cross-sectional view taken along V-V' of FIG. 19 may be similar to FIG. 5 or FIG. 11.

Figure 20:
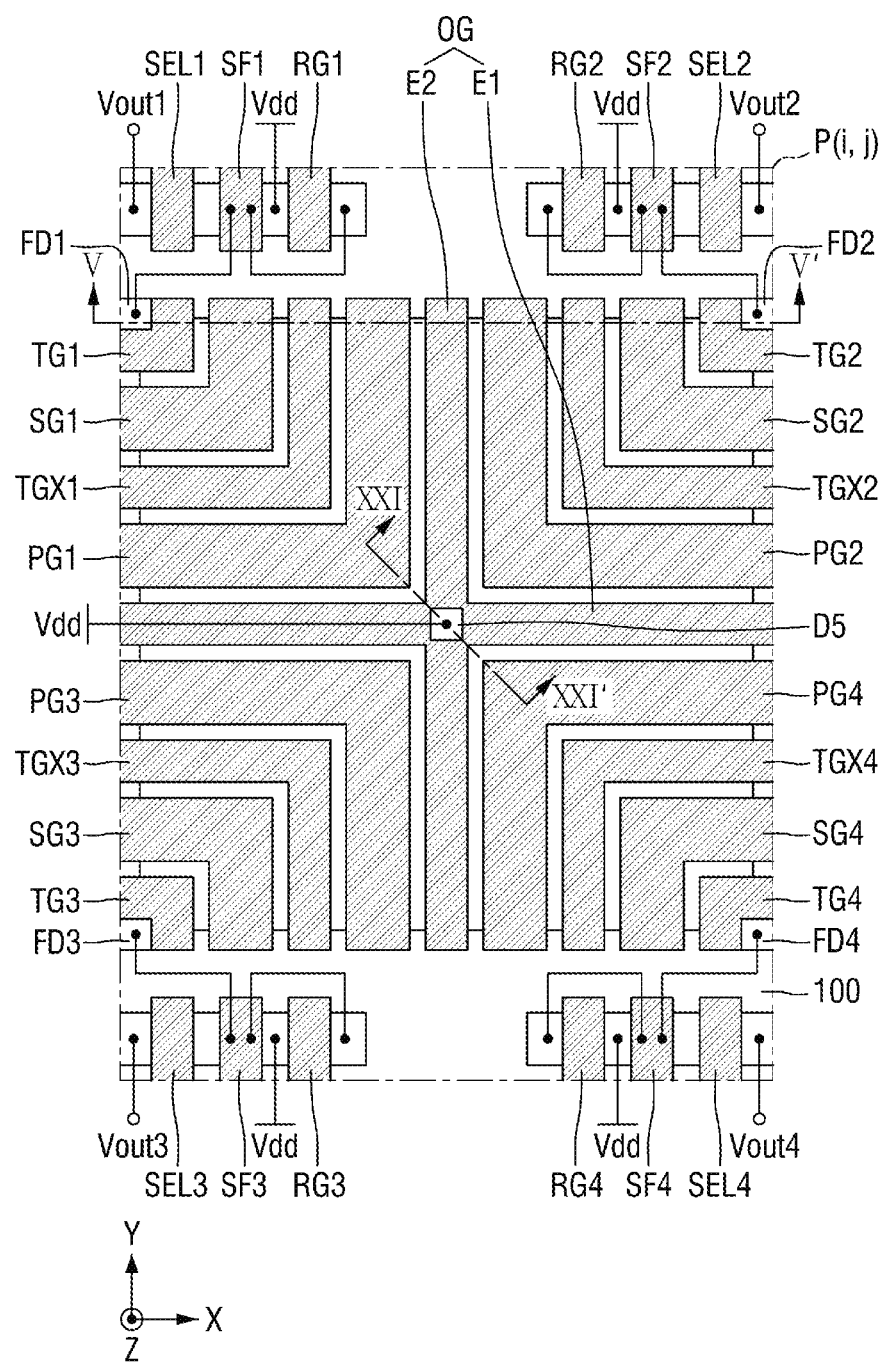
FIG. 20 is an example layout diagram for describing the first pixel region according to some example embodiments.
Figure 21:
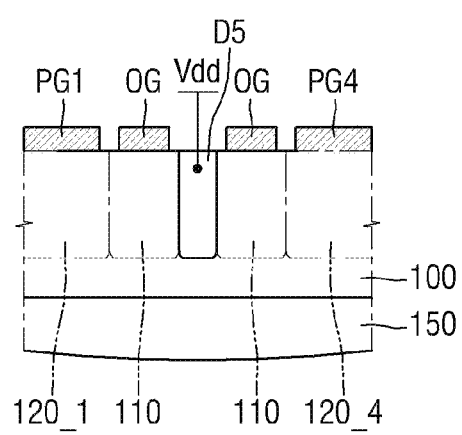
FIG. 21 is a cross-sectional view taken along line XXI-XXI' of FIG. 20.

FIG. 20 is an example layout diagram for describing the first pixel region according to some example embodiments. FIG. 21 is a cross-sectional view taken along line XXI-XXI' of FIG. 20. For the sake of convenience of explanation, repeated or similar contents of the aforementioned contents will be omitted or briefly explained.

Referring to FIGS. 15, 16 and 20, the first overflow gate OG may include a first extension portion E1 extending in the second direction X, between the first photo gate PG1 and the third photo gate PG3, and between the second photo gate PG2 and the four photo gates PG4. In addition, the first overflow gate OG may include a second extension portion E2 extending in the second directions Y, between the first photo gate PG1 and the second photo gate PG2, and between the third photo gate PG3 and the fourth photo gate PG4.

A fifth drain region D5 may be formed in a region in which the first extension portion E1 and the second extension portion E2 intersect each other, such that the image sensor 90 includes a fifth drain region D5 in a region in which the first extension portion E1 and the second extension portion E2 intersect each other. A power supply voltage Vdd may be applied to the fifth drain region D5. According to some example embodiments, when a turn-off voltage (e.g., a ground voltage) is applied to the first overflow gate OG, the first channel region 110 may restrict the charge movement between the charge collection regions formed below the first photo gate PG1 to the fourth photo gate PG4. In some example embodiments, when a turn-on voltage (e.g., a driving voltage) is applied to the first overflow gate OG, the first channel region 110 receives the charge from the charge collection regions formed below the first photo gate PG1 to the fourth photo gate PG4, and may discharge the charge to the fifth drain region D5.

For example, referring to FIG. 21, when a turn-off voltage (e.g., a ground voltage) is applied to the first overflow gate OG, the first channel region 110 may restrict the charge movement between the first charge collection region 120_1 and the fourth charge collection region 120_4. In addition, when a turn-on voltage (e.g., a driving voltage) is applied to the first overflow gate OG, the first channel region 110 receives the charge from the first charge collection region 120_1 and the fourth charge collection region 120_4, and may discharge the charge to the fifth drain region D5. In other words, the first overflow gate OG may be a gate of the transistor in which the first charge collection region 120_1 to the fourth charge collection region 120_4 are set as a source, and the fifth drain region D5 is set as a drain. The cross-sectional view taken along V-V' of FIG. 20 may be similar to FIG. 5 or FIG. 11.

Figure 22:
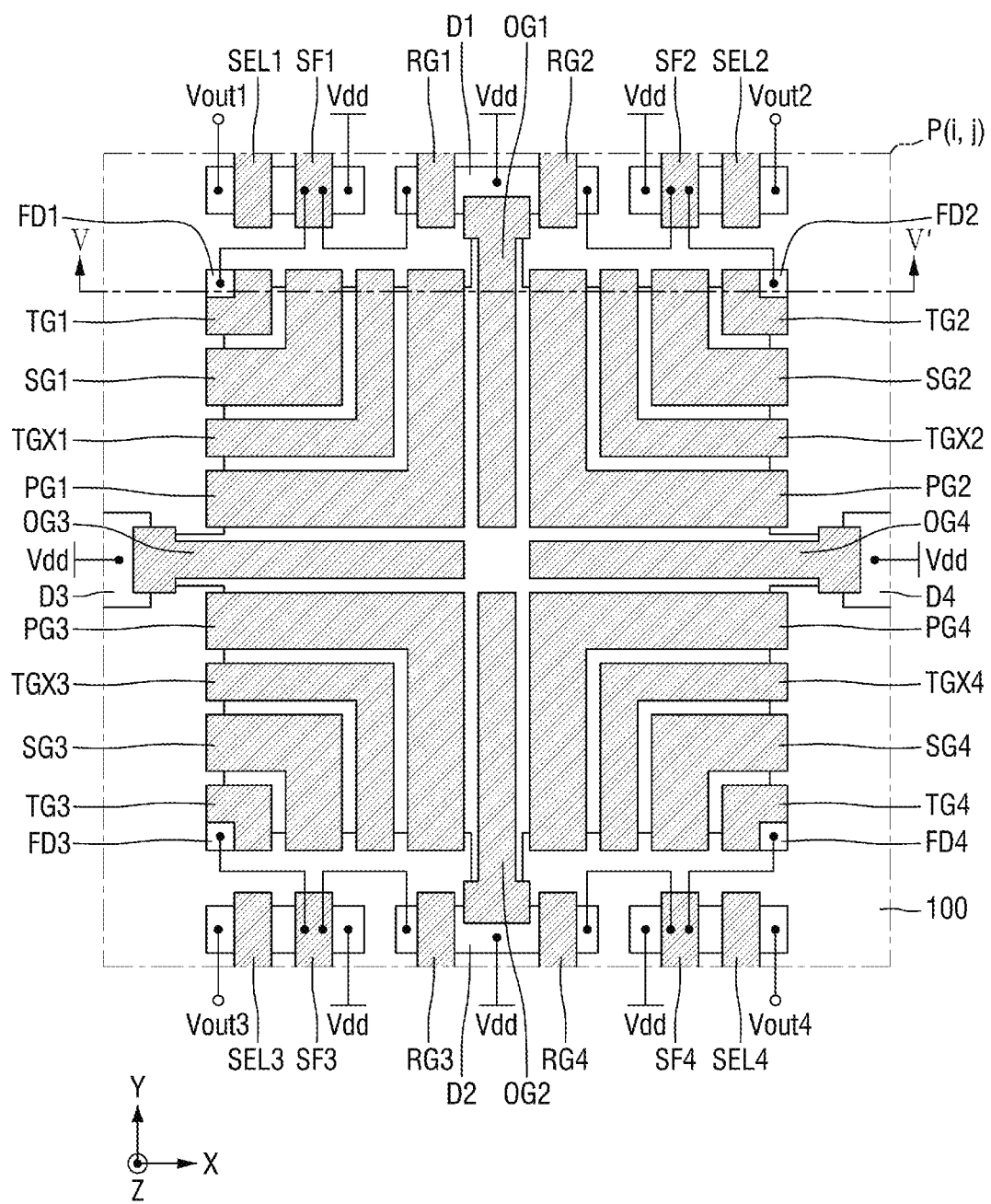
FIG. 22 is an example layout diagram illustrating a first pixel region according to some example embodiments.

FIG. 22 is an example layout diagram illustrating a first pixel region according to some example embodiments. For the sake of convenience of explanation, repeated or similar contents of the aforementioned contents will be omitted or briefly explained.

Referring to FIGS. 15, 16 and 22, the image sensor 90 may include a second overflow gate OG1 that may extend from the first drain region D1 in the first direction Y between the first photo gate PG1 and the second photo gate PG2. In some example embodiments, the image sensor 90 may include a third overflow gate OG2 that may extend from the second drain region D2 in the first direction Y between the third photo gate PG3 and the fourth photo gate PG4. In some example embodiments, image sensor 90 may include a the fourth overflow gate OG3 (e.g., which may be on at least one side of the first photo gate PG1 as shown in at least FIG. 22) that may extend from the third drain region D3 in the second direction X between the first photo gate PG1 and the third photo gate PG3. In some example embodiments, image sensor 90 may include a fifth overflow gate OG4 that may extend from the fourth drain region D4 in the second direction X between the second photo gate PG2 and the fourth photo gate PG4. In other words, the first overflow gate OG of FIG. 17 may operate by being divided into a plurality of overflow gates (e.g., the second overflow gate OG1 to the fifth overflow gate OG4). As shown, each photo gate of the first photo gate PG1 and the second photo gate PG2 may extend in the first and second directions Y and X. The cross-sectional view taken along V-V' of FIG. 22 may be similar to FIG. 5 or FIG. 11.

Figure 23:
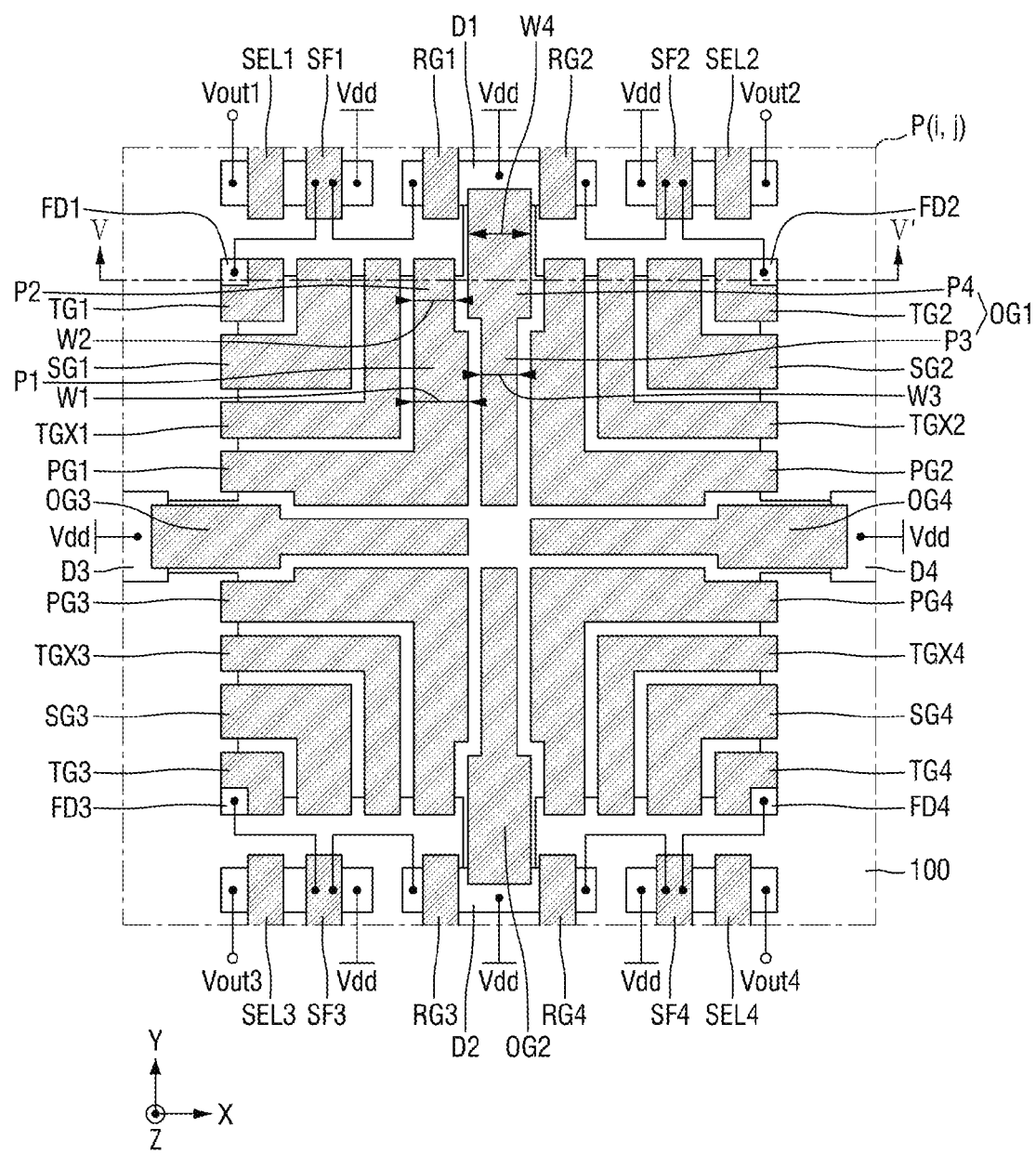
FIG. 23 is an example layout diagram illustrating the first pixel region according to some example embodiments.

FIG. 23 is an example layout diagram illustrating the first pixel region according to some example embodiments. For the sake of convenience of explanation, repeated or similar contents of the aforementioned contents will be omitted or briefly explained.

Referring to FIGS. 15, 16 and 23, the first portion P1 of the first photo gate PG1 may overlap the third portion P3 of the second overflow gate OG1 in the second direction X. The second portion P2 of the first photo gate PG1 may overlap the fourth portion P4 of the second overflow gate OG1 in the second direction X. Since the third overflow gate OG2 to the fifth overflow gate OG4 are similar to the second overflow gate OG1, a detailed description thereof will not be provided. The cross-sectional view taken along V-V' of FIG. 23 may be similar to FIG. 5 or FIG. 11.

Figure 24:
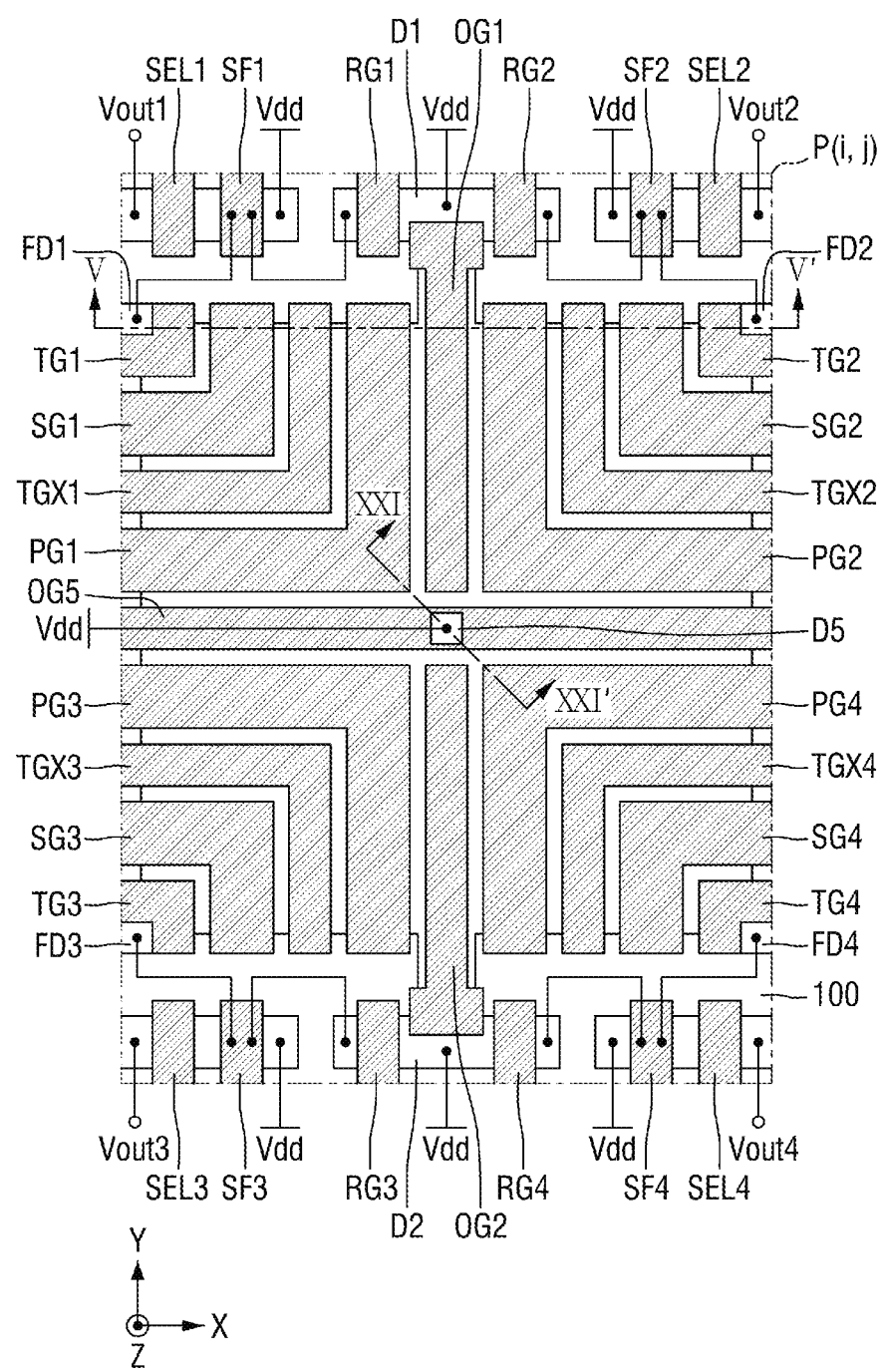
FIG. 24 is an example layout diagram illustrating the first pixel region according to some example embodiments.

FIG. 24 is an example layout diagram illustrating the first pixel region according to some example embodiments. For the sake of convenience of explanation, repeated or similar contents of the aforementioned contents will be omitted or briefly explained.

Referring to FIGS. 15, 16 and 24, the second overflow gate OG1 may extend from the first drain region D1 in the first direction Y between the first photo gate PG1 and the second photo gate PG2. In some example embodiments, the third overflow gate OG2 may extend from the second drain region D2 in the first direction Y between the third photo gate PG3 and the fourth photo gate PG4. Further, the sixth overflow gate OG5 may extend in the second direction X, between the first photo gate PG1 and the third photo gate PG3, and between the second photo gate PG2 and the fourth photo gate PG4. The fifth drain region D5 may be formed in a region in which the second overflow gate OG1, the third overflow gate OG2 and the sixth overflow gate OG5 overlap each other in the first direction Y. The power supply voltage Vdd may be applied to the fifth drain region D5. The cross-sectional view taken along V-V' of FIG. 24 may be similar to FIG. 5 or FIG. 11. The cross-sectional view taken along the line XXI-XXI' of FIG. 24 may be similar to FIG. 21.

Figure 25:
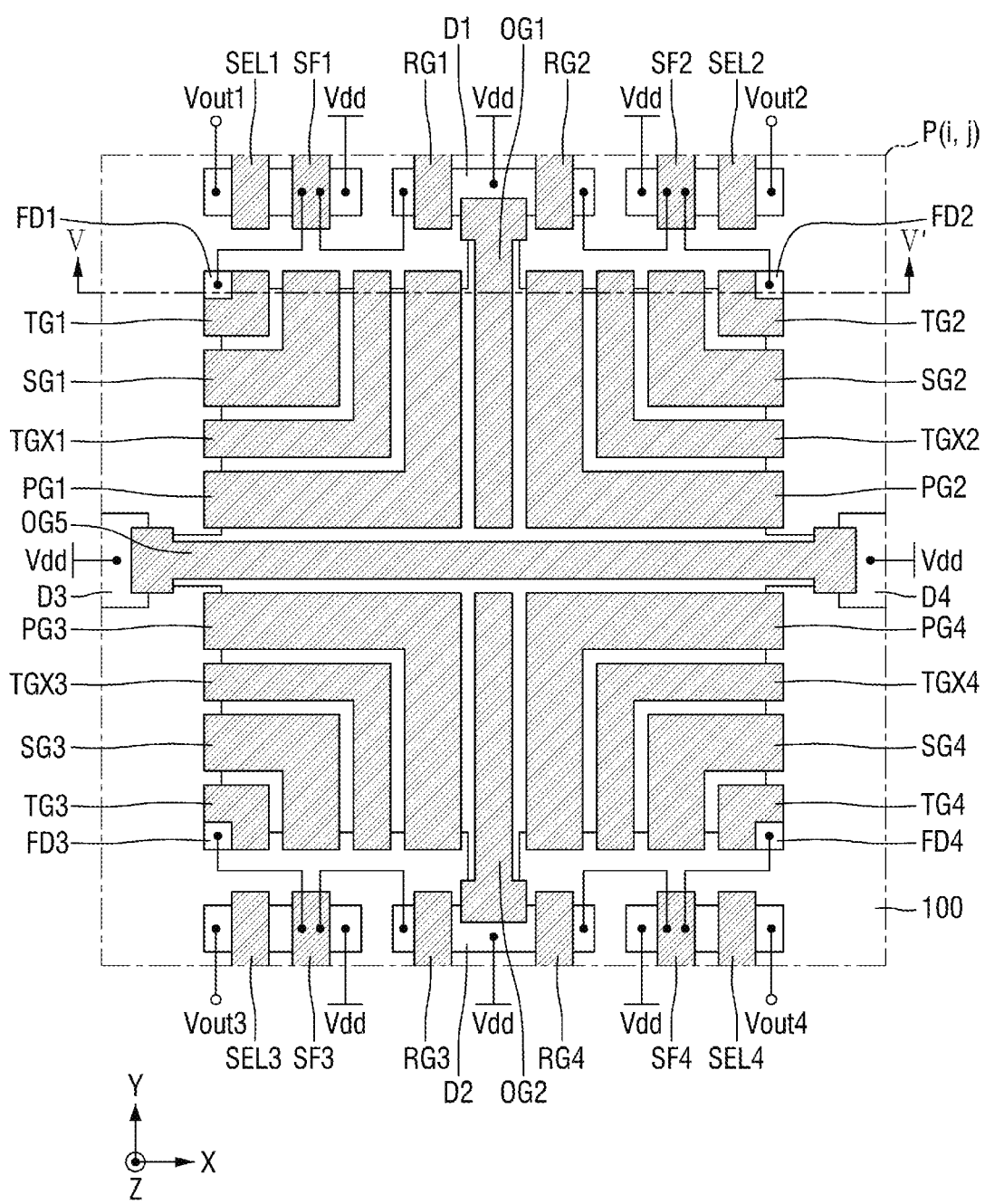
FIG. 25 is an example layout for illustrating the first pixel region according to some example embodiments.

FIG. 25 is an example layout for illustrating the first pixel region according to some example embodiments. For the sake of convenience of explanation, repeated or similar contents of the aforementioned contents will be omitted or briefly explained.

Referring to FIGS. 15, 16 and 25, the sixth overflow gate OG5 may extend from the third drain region D3 to the fourth drain region D4 in the second direction X, between the first photo gate PG1 and the third photo gate PG3, and between the second photo gate PG2 and the fourth photo gate PG4. The cross-sectional view taken along V-V' of FIG. 25 may be similar to FIG. 5 or FIG. 11.

Figure 26:
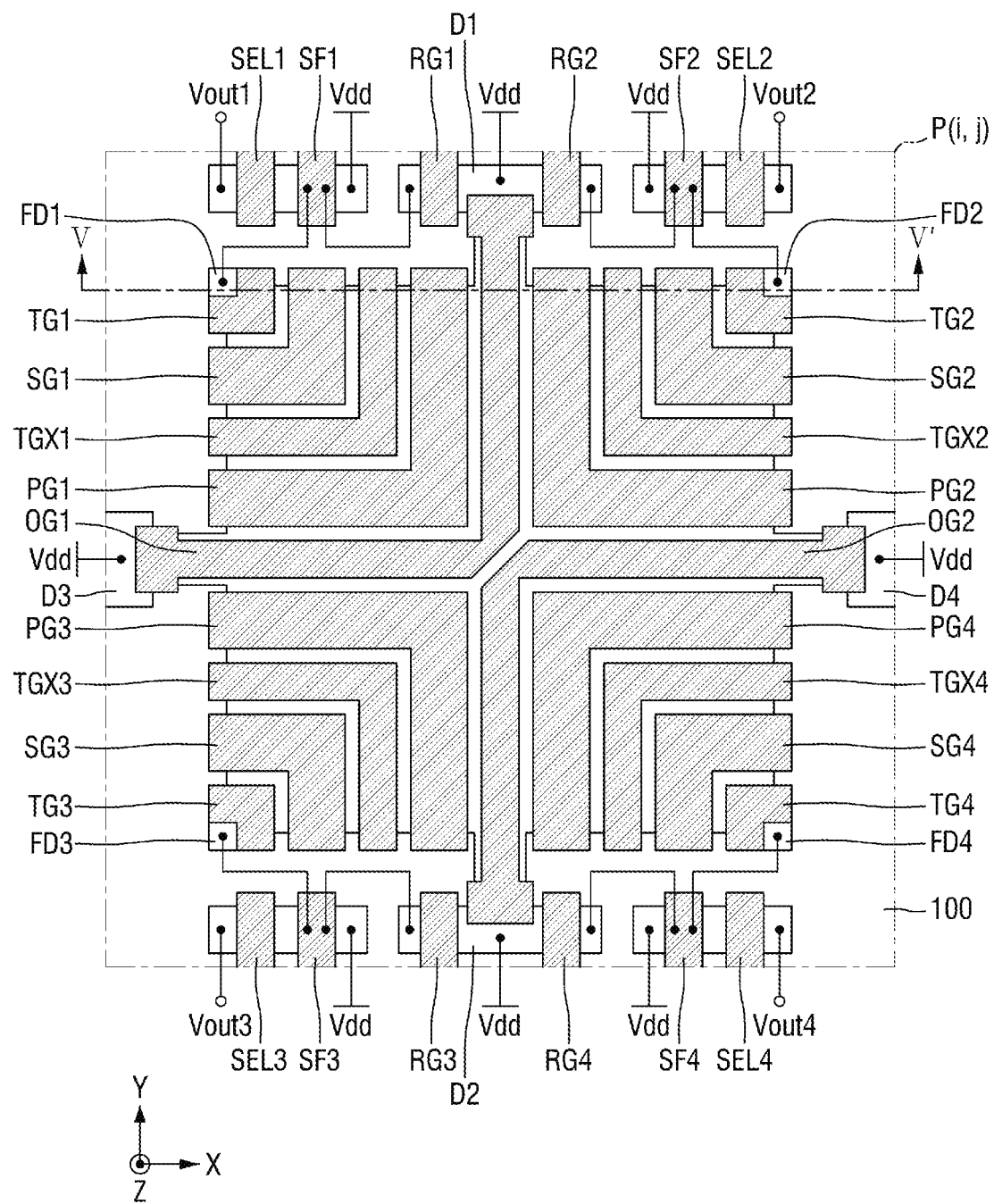
FIG. 26 is an example layout diagram illustrating the first pixel region according to some example embodiments.

FIG. 26 is an example layout diagram illustrating the first pixel region according to some example embodiments. For the sake of convenience of explanation, repeated or similar contents of the aforementioned contents will be omitted or briefly explained.

Referring to FIGS. 15 16 and 26, the second overflow gate OG1 may extend in the first direction Y between the first photo gate PG1 and the second photo gate PG2, and may extend in the second direction X between the first photo gate PG1 and the third photo gate PG3. At this time, the second overflow gate OG1 may extend from the first drain region D1 to the third drain region D3. Similarly, the third overflow gate OG2 may extend from the second drain region D2 to the fourth drain region D4 along the second direction X and the first direction Y. The cross-sectional view taken along line V-V' of FIG. 26 may be similar to FIG. 5 or FIG. 11.

Figure 27:
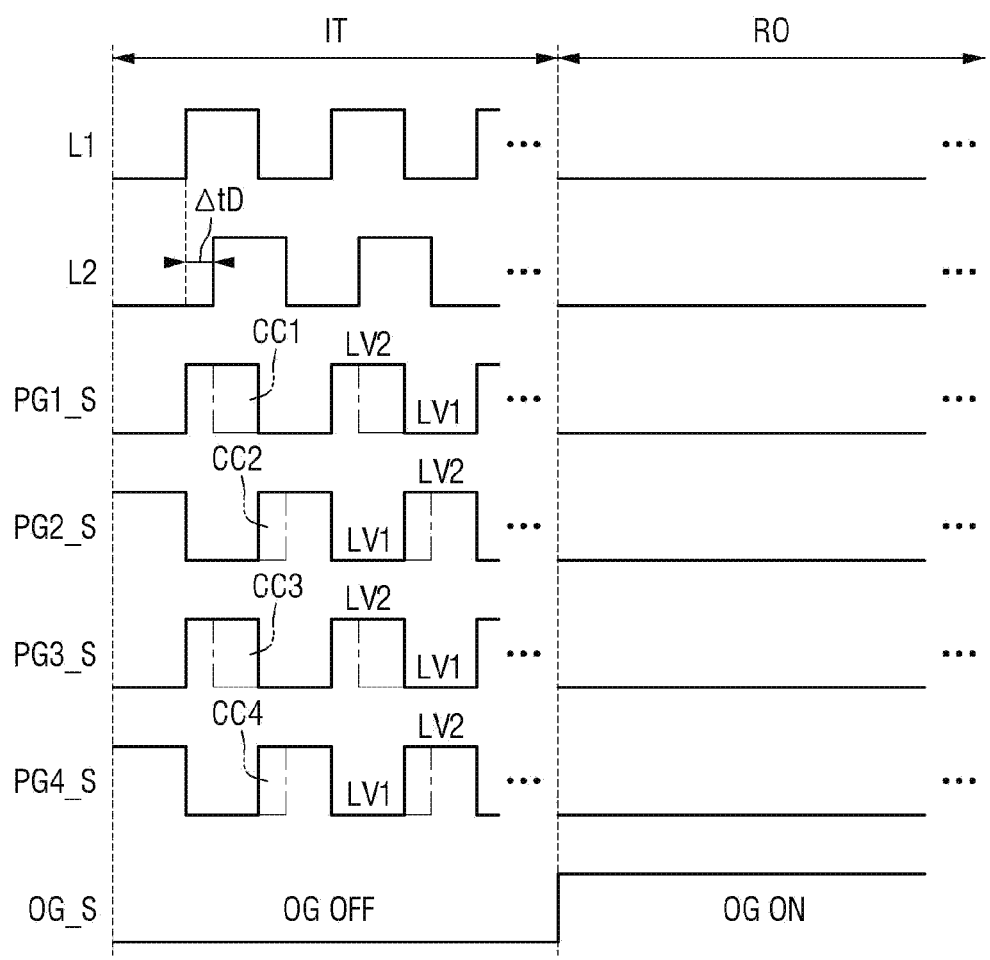
FIG. 27 is an example timing diagram illustrating signals for driving the first pixel region according to some example embodiments, respectively.
Figure 28:
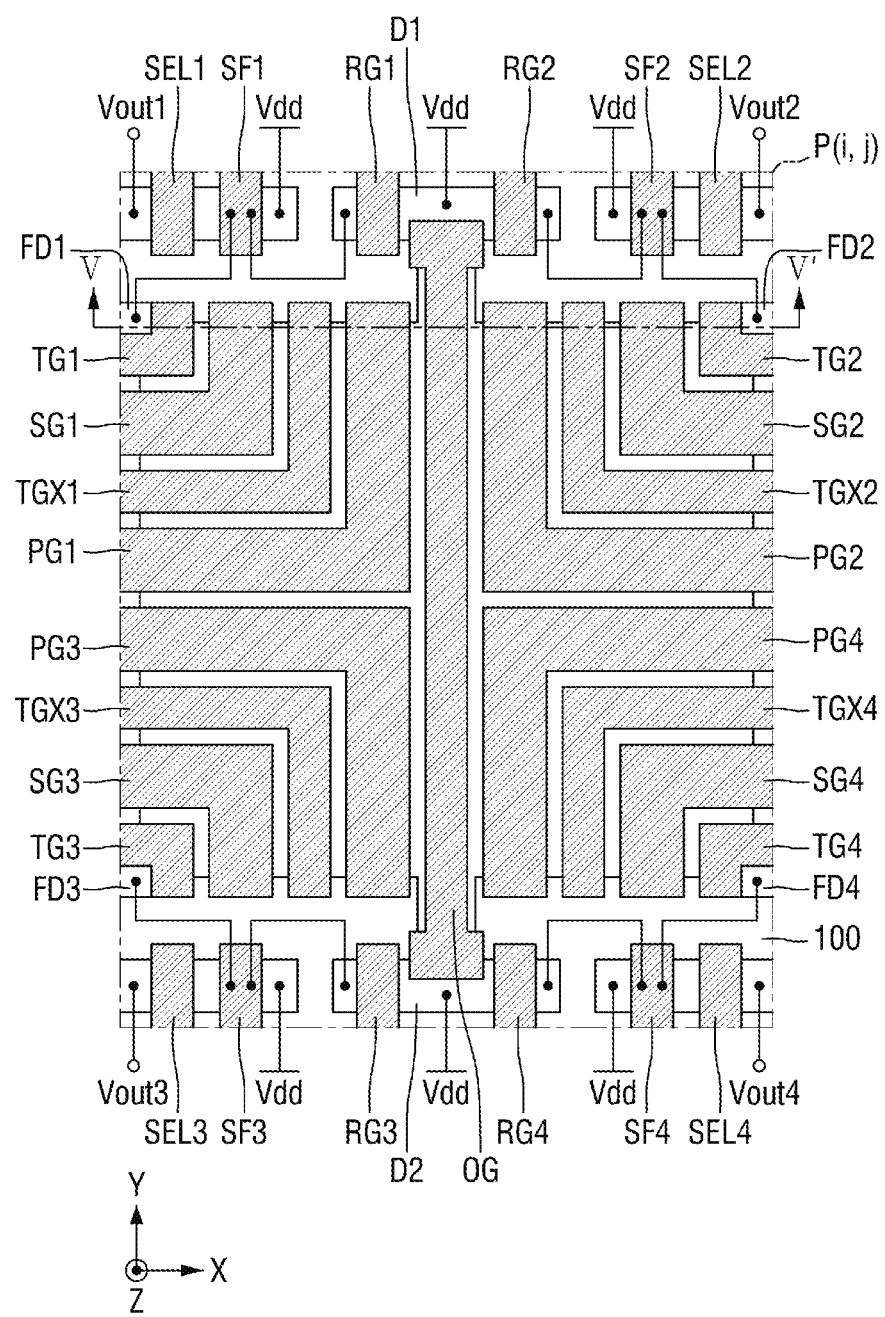
FIG. 28 is an example layout for illustrating the first pixel region according to some example embodiments.
Figure 29:
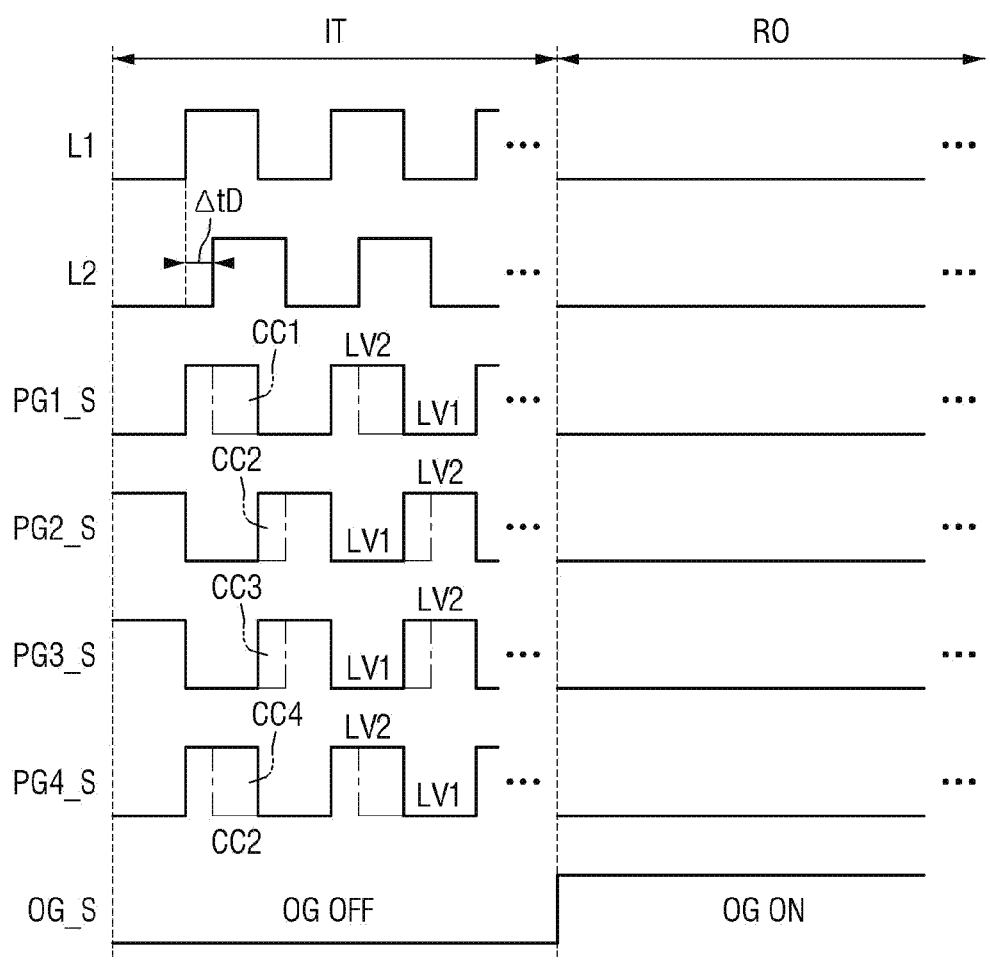
FIG. 29 is an example timing diagram illustrating signals for driving the first pixel region according to some example embodiments.

FIG. 27 is an example timing diagram illustrating signals for driving the first pixel region according to some example embodiments, respectively. FIG. 28 is an example layout for illustrating the first pixel region according to some example embodiments. FIG. 29 is an example timing diagram illustrating signals for driving the first pixel region according to some example embodiments. For the sake of convenience of explanation, repeated or similar contents of the aforementioned contents will be omitted or briefly explained.

According to some example embodiments, at least some of the signals applied to the plurality of photo gates may be synchronized. For example, referring to FIGS. 1, 15 and 27, a first signal PG1_S to a fourth signal PG4_S may be provided to the first photo gate PG1 to the fourth photo gate PG4, respectively. At this time, the first signal PG1_S and the third signal PG3_S may be synchronized with each other, and the second signal PG2_S and the fourth signal PG4_S may be synchronized with each other. For example, the timing generator 20 may output a signal having the same phase as the first optical signal L1 to the first signal PG1_S and the third signal PG3_S. Further, the timing generator 20 may output a signal having a phase opposite to that of the first optical signal L1 to the second signal PG2_S and the fourth signal PG4_S. Charges are generated below the first photo gate PG1 and the third photo gate PG3 in the first charge generation section CC1 and the third charge generation section CC3, and charges may be generated below the second photo gate PG2 and the fourth photo gate PG4 in the second charge generation section CC2 and the fourth charge generation section CC4. At this time, since a plurality of photo gates is used in the same charge generation section, the sensing ability of the distance measuring sensor 1 can be improved.

At this time, when signals synchronized with the photo gates adjacent to each other are provided, respectively, as illustrated in FIG. 28, the overflow gate between the photo gates adjacent to each other may be omitted. For example, an overflow gate may not be disposed between the first photo gate PG1 and the third photo gate PG3, and between the second photo gate PG2 and the fourth photo gate PG4. The cross-sectional view taken along V-V' of FIG. 28 may be similar to FIG. 5 or FIG. 11.

Unlike in FIG. 27, the signals provided to the photo gates disposed diagonally to each other may, of course, be synchronized. For example, referring to FIG. 29, the first signal PG1_S and the fourth signal PG4_S are synchronized, and the second signal PG2_S and the third signal PG3_S may be synchronized.

Figure 30:
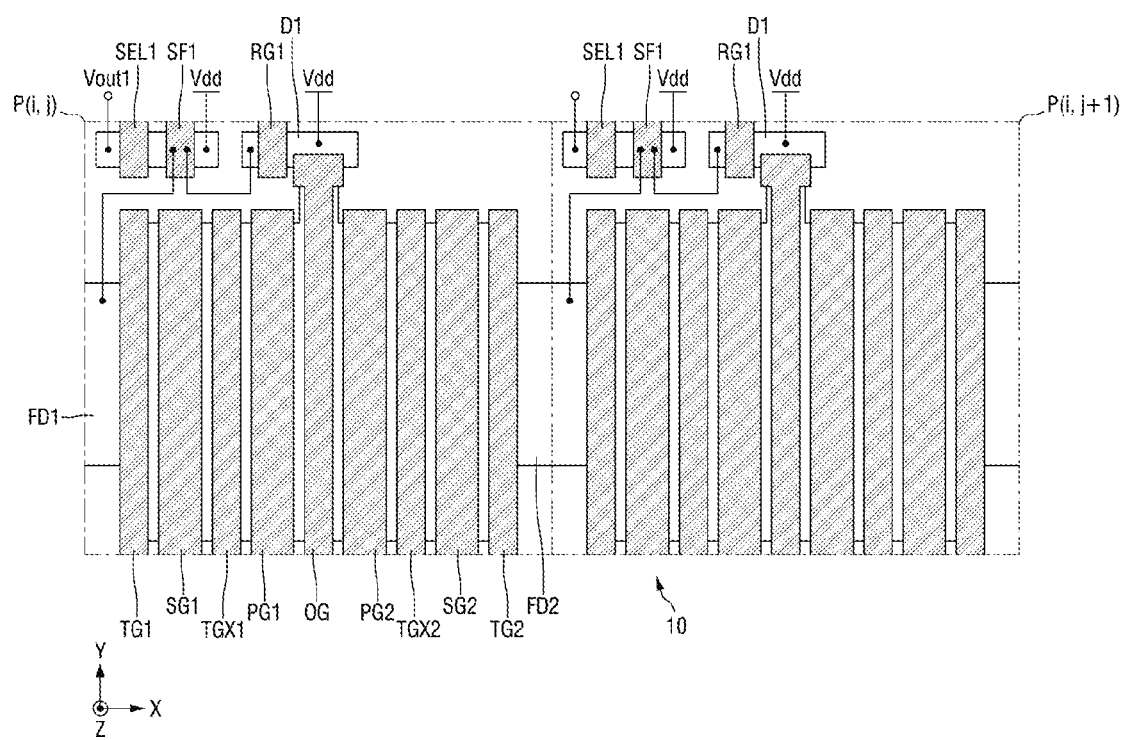
FIG. 30 is an example layout diagram for illustrating a first pixel region and a second pixel region according to some example embodiments.

FIG. 30 is an example layout diagram for illustrating a first pixel region and a second pixel region according to some example embodiments.

Referring to FIG. 30, an image sensor 90 according to some example embodiments may adopt a structure which shares the floating diffusion region. For example, the second floating diffusion region FD2 of the first pixel region P (i, j) may be used in the second pixel region P (i, j+1). Restated, and as shown in FIG. 30, a pixel array 10 of the image sensor 90 may include a first pixel region P (i, j) and a second pixel region P (i, j+1), and the pixel array 10 may further include a floating diffusion region FD2 that is configured to generate an electrical signal, wherein the first pixel region P (i, j) and the second pixel region P (i, j+1) share the floating diffusion region FD2. For example, as shown in FIG. 30, the floating diffusion region FD2 may extend through and between both the first pixel region P (i, j) and the second pixel region P (i, j+1). Similarly, the first selection gate SEL1, the first source follower gate SF1 and the first reset gate RG1 of the second pixel region P (i, j+1) may be partially shared with the first pixel region P (i, j). However, the embodiments are not limited to the layout of FIG. 30, and those having ordinary skill in the technical field of the present inventive concepts may implement the pixel array sharing the floating diffusion region in various ways, without departing from the scope of the present inventive concepts.

Figure 31:
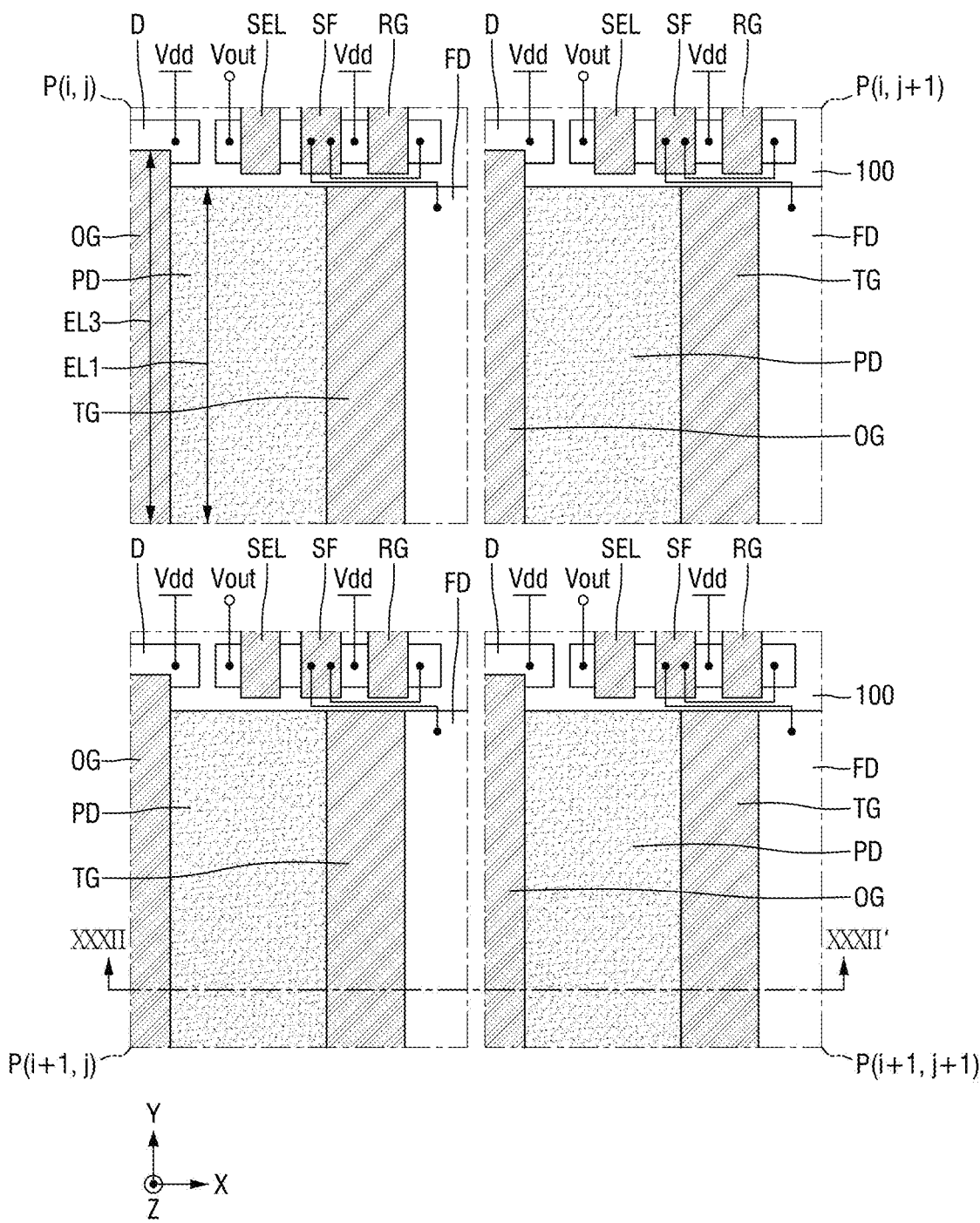
FIG. 31 is an example layout diagram illustrating the pixel array according to some example embodiments.
Figure 32:
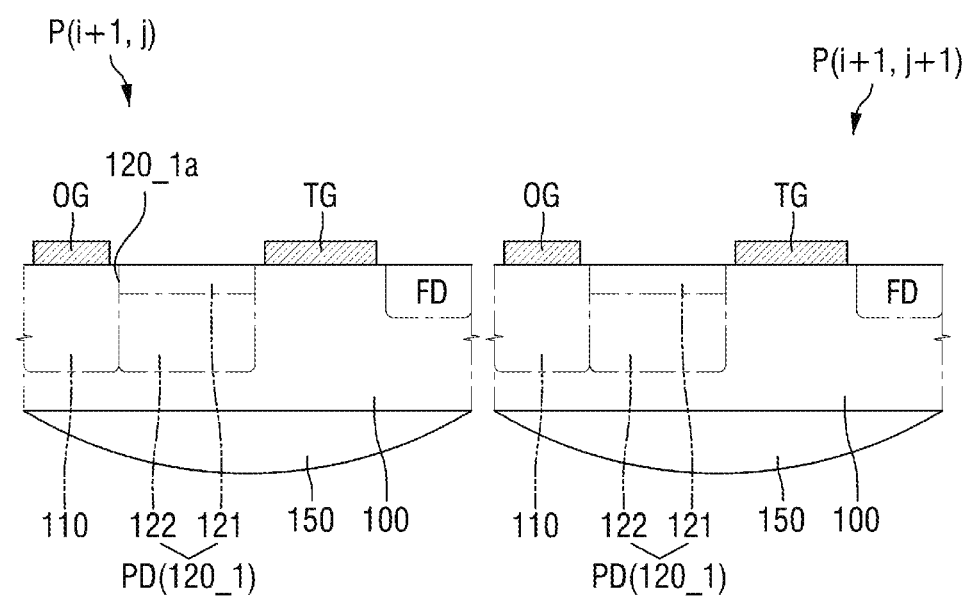
FIG. 32 is a cross-sectional view taken along line XXXII-XXXII' of FIG. 31.
Figure 33:
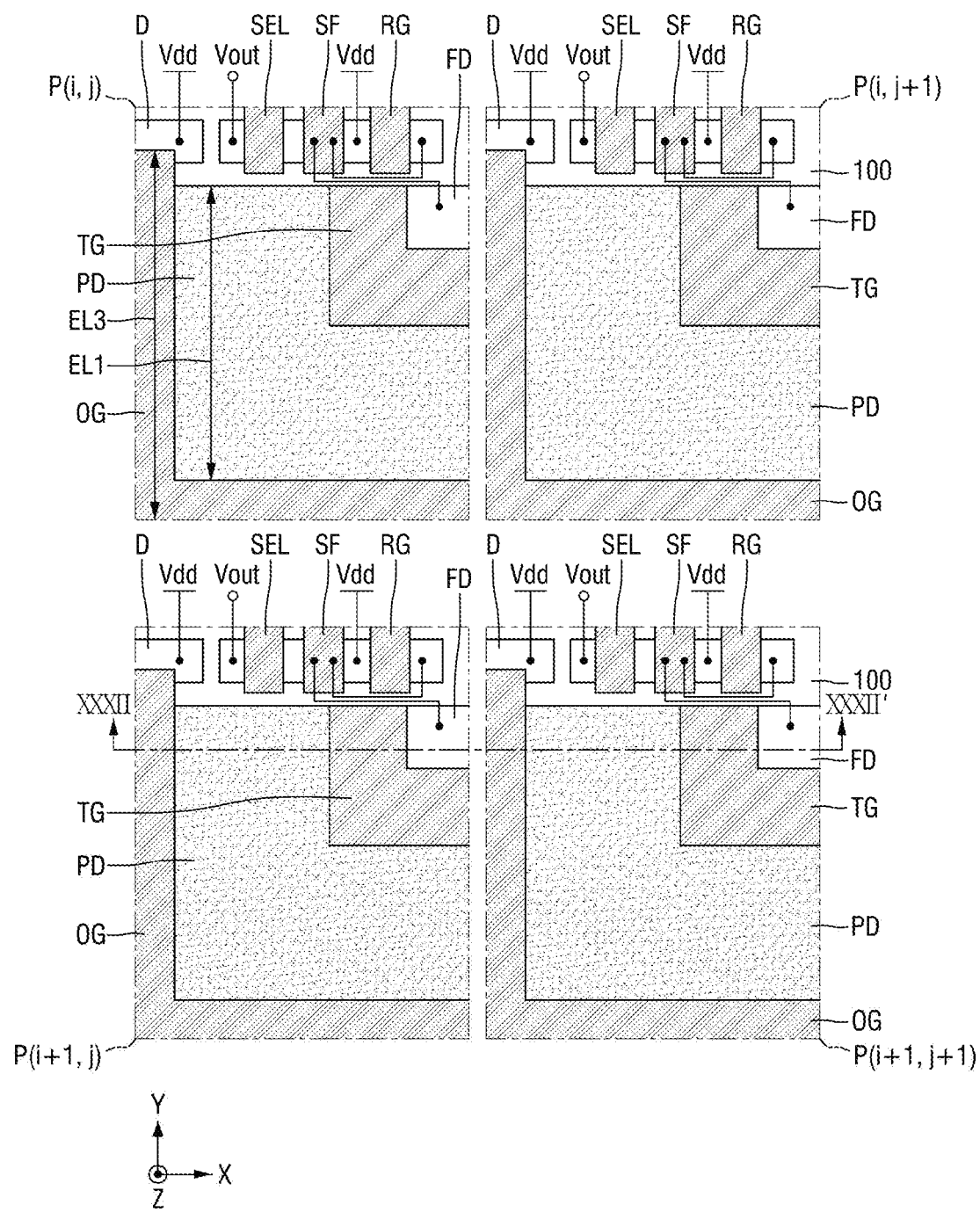
FIG. 33 is an example layout diagram illustrating the pixel array according to some example embodiments.

FIG. 31 is an example layout diagram illustrating the pixel array according to some example embodiments. FIG. 32 is a cross-sectional view taken along line XXXII-XXXII' of FIG. 31. FIG. 33 is an example layout diagram illustrating the pixel array according to some example embodiments. For the sake of convenience of explanation, repeated or similar contents of the aforementioned contents will be omitted or briefly explained.

The technical idea of the present inventive concepts may also be applied to a general image sensor 90. Referring to FIGS. 1, 31 and 32, the pixel array 10 may include a first pixel region P (i, j), a second pixel region P (i, j+1), a third pixel region P (i+1, j) and a fourth pixel region P (i+1, j+1). The first pixel region P (i, j) to the fourth pixel region P (i+1, j+1) may be similar to each other.

The first pixel region P (i, j) may include a substrate 100, a floating diffusion region FD (e.g., a first floating diffusion region), a transmission gate TG (e.g., a first transmission gate), a photodiode PD (e.g., a first photoelectric device), a first overflow gate OG, a reset gate RG, a source follower gate SF, a selection gate SEL, and a drain region D. The floating diffusion region FD, the transmission gate TG and the photodiode PD may extend in the first direction Y. The photodiode PD may be configured to receive an optical signal and convert the optical signal into an electric signal, the floating diffusion region FD may be configured to receive the electric signal and output the electric signal, and the transmission gate TG may be configured to provide the electric signal stored in the photodiode PD to the floating diffusion region FD. As shown in at least FIG. 31, the first overflow gate OG may be on at least one side surface (e.g., a first surface 120_1a) of the photodiode PD and may extend along the at least one side surface of the photodiode PD. In other words, the first overflow gate OG may extend from the drain region D in the first direction Y, on at least one side surface of the photodiode PD. At this time, a first length EL1 by which the photodiode PD extends in the first direction Y, which may be referred to as a total length of the photodiode PD in the first direction Y, may be smaller than a third length EL3 by which the first overflow gate OG extends in the first direction Y, which may be referred to as a total length of the first overflow gate OG in the first direction Y. The first overflow gate OG may prevent the charge movement between the photodiode PD and the floating diffusion region FD of the pixel regions adjacent to each other (e.g., the first pixel region P (i, j) and the second pixel region P (i, j+1)). In some example embodiments, the first overflow gate OG may be used to reset the photodiode PD. For example, when a turn-on voltage (e.g., a driving voltage) is applied to the first overflow gate OG of the second pixel region P (i, j+1), the first channel region 110 of the second pixel region P (i, j+1) may receive and discharge the charges from the photodiode PD of the second pixel region P (i, j+1). In some example embodiments, when a turn-off voltage (e.g., a ground voltage) is applied to the first overflow gate OG of the second pixel region P (i, j+1), the charge movement between the photodiode PD of the second pixel region P (i, j+1) and the floating diffusion region FD of the first pixel region P (i, j) may be restricted, due to the first channel region 110 of the second pixel region P (i, j+1). The charge provided to the floating diffusion region FD may be output to the output voltage Vout via the source follower gate SF and the selection gate SEL. Accordingly, it will be understood that the first channel region 110 may be configured to selectively regulate charge movement between the photodiode PD that is at least partially defined by the first charge collection region 120_1 and an exterior of the photodiode PD that is at least partially defined by the first charge collection region 120_1 (e.g., block charge movement from the photodiode PD that is at least partially defined by the first charge collection region 120_1 or receive charge from the photodiode PD that is at least partially defined by the first charge collection region 120_1), based on a signal provided to the first overflow gate OG.

Referring to FIG. 33, the photodiode PD may extend in the second direction X and the first direction Y. The first overflow gate OG may extend along at least one side surface of the photodiode PD. For example, the first overflow gate OG may extend in the second direction X along one side surface of the photodiode PD, and may extend in the first direction Y along the other second side surface of the photodiode PD. At this time, the first length EL1 of the photodiode PD extending in the first direction Y may be smaller than the third length EL3 of the first overflow gate OG extending in the first direction Y. The cross-sectional view taken along the line XXXII-XXXII' of FIG. 33 may be similar to FIG. 32.

In concluding the detailed description, those skilled in the art will appreciate that many variations and modifications may be made to the example embodiments without substantially departing from the principles of the present inventive concepts. Therefore, the disclosed example embodiments of the inventive concepts are used in a generic and descriptive sense only and not for purposes of limitation.

What is claimed is:

1. An image sensor, comprising:
   a first photo gate and a second photo gate, each photo gate of the first photo gate and the second photo gate extending substantially in parallel in a first direction, the first photo gate and the second photo gate isolated from direct contact with each other in a second direction, the second direction substantially orthogonal to the first direction, the first photo gate including a first portion having a first width in the second direction and a second portion having a second width in the second direction, the first width and the second width being different from each other;
   a first overflow gate between the first photo gate and the second photo gate, the first overflow gate extending in the first direction, the first overflow gate including a third portion having a third width in the second direction and a fourth portion having a fourth width in the second direction, the third portion overlapping the first portion in the second direction and the fourth portion overlapping the second portion in the second direction, the third width and the fourth width being different from each other;
   a first charge collection region on the first photo gate;
   a second charge collection region on the second photo gate, the first charge collection region and the second charge collection region isolated from direct contact with each other in the second direction;
   a first floating diffusion region configured to receive a first charge from the first charge collection region and to output the first charge; and
   a second floating diffusion region configured to receive a second charge from the second charge collection region and output the second charge.

2. The image sensor of claim 1, wherein
   the first overflow gate extends to a first drain region, and
   the image sensor is configured to apply a power supply voltage to the first drain region.

3. The image sensor of claim 1, further comprising:
   a first channel region on the first overflow gate,
   wherein the first channel region is configured to selectively block charge movement between the first charge collection region and the second charge collection region or receive the first charge and the second charge from the first charge collection region and the second charge collection region, respectively, based on a signal provided to the first overflow gate.

4. The image sensor of claim 3, wherein the first channel region includes a p-type impurity.

5. The image sensor of claim 3, wherein the first channel region includes an n-type impurity.

6. The image sensor of claim 1, further comprising:
a first charge storage region isolated from direct contact with the first charge collection region in the second direction, the first charge storage region configured to receive and store the first charge from the first charge collection region; and
a second charge storage region isolated from direct contact with the second charge collection region in the second direction, the second charge storage region configured to receive and store the second charge from the second charge collection region.

7. The image sensor of claim 6, further comprising:
a first barrier region on the first charge storage region, the first barrier region including a p-type impurity; and
a second barrier region on the second charge storage region, the second barrier region including the p-type impurity.

8. The image sensor of claim 1, further comprising:
a first collection charge transmission gate isolated from direct contact with the first photo gate in the second direction and extending in the first direction;
a first transmission gate isolated from direct contact with the first collection charge transmission gate in the second direction and extending in the first direction;
a second collection charge transmission gate isolated from direct contact with the second photo gate in the second direction and extending in the first direction; and
a second transmission gate isolated from direct contact with the second collection charge transmission gate in the second direction and extending in the first direction.

9. The image sensor of claim 8, further comprising:
a first charge storage region on the first collection charge transmission gate, the first charge storage region configured to receive and store the first charge from the first charge collection region; and
a second charge storage region on the second collection charge transmission gate, the second charge storage region configured to receive and store the second charge from the second charge collection region.

10. The image sensor of claim 8, further comprising:
a first storage gate between the first collection charge transmission gate and the first transmission gate, the first storage gate extending in the first direction;
a second storage gate between the second collection charge transmission gate and the second transmission gate, the second storage gate extending in the first direction;
a first charge storage region on the first storage gate, the first charge storage region configured to receive and store the first charge from the first charge collection region; and
a second charge storage region on the second storage gate, the second charge storage region configured to receive and store the second charge from the second charge collection region.

11. The image sensor of claim 1, wherein a total length of the first overflow gate in the first direction is greater than each of a total length of the first photo gate in the first direction and a total length of the second photo gate in the first direction.

* * * * *